(12) United States Patent
Ujiie

(10) Patent No.: US 9,711,642 B2
(45) Date of Patent: *Jul. 18, 2017

(54) SEMICONDUCTOR DEVICE AND MANUFACTURING METHOD THEREOF

(71) Applicant: ROHM CO., LTD., Kyoto (JP)

(72) Inventor: Yohei Ujiie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/143,126

(22) Filed: Apr. 29, 2016

(65) Prior Publication Data

US 2016/0247912 A1 Aug. 25, 2016

Related U.S. Application Data

(63) Continuation of application No. 14/218,830, filed on Mar. 18, 2014, now Pat. No. 9,356,143.

(30) Foreign Application Priority Data

Mar. 19, 2013 (JP) .................................. 2013-57307
Feb. 7, 2014 (JP) .................................. 2014-22686

(51) Int. Cl.
*H01L 29/78* (2006.01)
*H01L 21/761* (2006.01)
*H01L 29/06* (2006.01)
*H01L 29/10* (2006.01)
*H01L 21/265* (2006.01)
(Continued)

(52) U.S. Cl.
CPC ........ *H01L 29/7816* (2013.01); *H01L 21/266* (2013.01); *H01L 21/26513* (2013.01); *H01L 21/761* (2013.01); *H01L 29/0634* (2013.01); *H01L 29/0653* (2013.01); *H01L 29/105* (2013.01); *H01L 29/1045* (2013.01); *H01L 29/1083* (2013.01); *H01L 29/1095* (2013.01); *H01L 29/66681* (2013.01); *H01L 29/7833* (2013.01)

(58) Field of Classification Search
CPC ..................... H01L 29/7816; H01L 29/1045
See application file for complete search history.

(56) References Cited

U.S. PATENT DOCUMENTS 8,476,684 B2   7/2013  Coyne et al.
9,356,143 B2 *  5/2016  Ujiie ............... H01L 21/761
(Continued)

FOREIGN PATENT DOCUMENTS

JP   2009-278100 A   11/2009

*Primary Examiner* — Mark Prenty
(74) *Attorney, Agent, or Firm* — Chen Yoshimura LLP

(57) ABSTRACT

A semiconductor device includes: an n-type first source region and first drain region formed in a surface of a p-type epitaxial layer; an n-type first source drift region and first drain drift region formed so as to individually surround the first source region and the first drain region; and a p-type first diffusion region formed in a first channel region and having a higher concentration than the epitaxial layer, the semiconductor device having p-type first withstand voltage maintaining regions formed between the first diffusion region, and the first source drift region and first drain drift region respectively, the first withstand voltage maintaining regions having a lower concentration than the first diffusion region.

13 Claims, 16 Drawing Sheets

(51) Int. Cl.
*H01L 21/266* (2006.01)
*H01L 29/66* (2006.01)

(56) References Cited

U.S. PATENT DOCUMENTS

2008/0315306 A1 12/2008 Yoo et al.
2009/0283825 A1 11/2009 Wang et al.

\* cited by examiner

SEMICONDUCTOR DEVICE AND MANUFACTURING METHOD THEREOF

BACKGROUND OF THE INVENTION

Field of the Invention

The present invention relates to a semiconductor device and a method of manufacturing the same.

Description of Related Art

Patent Document 1 discloses a semiconductor device including a power MOSFET. The power MOSFET of the semiconductor device has a p-type semiconductor substrate, a p well formed on the semiconductor substrate, an $n^+$ source and an $n^+$ drain disposed at gaps from each other on the p well, an n drift disposed below the $n^+$ drain, and a gate electrode formed over the region between the $n^+$ source and the $n^+$ drain.

RELATED ART DOCUMENTS

Patent Documents

Patent Document 1: Japanese Patent Application Laid-Open Publication No. 2009-278100

SUMMARY OF THE INVENTION

A method of lowering the impurity concentration of the p well is under consideration as a method of raising the withstand voltage between the source region and the drain region (source/drain withstand voltage) in a high withstand voltage element having the power MOSFET structure of Patent Document 1, for example.

However, in the process of manufacturing the semiconductor device, a plurality of elements are typically formed simultaneously on a common semiconductor substrate. The semiconductor device of Patent Document 1 is no exception. Thus, when lowering the impurity concentration of the p well in the power MOSFET of Patent Document 1, it is necessary to form these p wells in a different step from p wells of other elements in order not to affect the concentration of the p wells of other elements in the same device. Specifically, it is necessary to add a step of forming a new mask layer on the semiconductor substrate and selectively doping a portion of the semiconductor substrate with a p-type impurity at a low concentration. The addition of this step results in a major change in the manufacturing process, resulting in increased costs.

An object of the present invention is to provide a semiconductor device and a method of manufacturing the same in which the source/drain withstand voltage can be stably improved while preventing an increase in the number of manufacturing steps.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a semiconductor device including: a semiconductor layer of a first conductive type having selectively formed therein a field effect transistor region; a source region and a drain region of a second conductive type formed in a surface of the semiconductor layer with a gap therebetween in the field effect transistor region; a pair of drift regions of the second conductive type formed with a gap therebetween so as to surround individually the source region and the drain region; a gate electrode formed over the surface of the semiconductor layer across a gate insulating film so as to face a channel region formed in the area between the pair of drift regions; and a first diffusion region of the first conductive type formed in the channel region at a gap from at least one of the drift regions, the first diffusion region having a concentration higher than the semiconductor layer, wherein, between the first diffusion region and the at least one of the drift regions, a first withstand voltage maintaining region of the first conductive type is present, the first withstand voltage maintaining region having a concentration lower than the first diffusion region.

According to this configuration, at least one of the drift regions forms a p-n junction with the low concentration first withstand voltage maintaining region that is a portion of the semiconductor layer. As a result, compared to forming the p-n junction with the relatively high concentration first conductive type region, it is possible to stably raise the withstand voltage between the source region and the drain region (source/drain withstand voltage).

The first withstand voltage maintaining regions are formed not in the entire channel region but selectively in portions that form junctions with the drift regions, and the first diffusion region having a higher concentration than the semiconductor layer (that is, a higher concentration than the first withstand voltage maintaining region) is formed in a portion at a gap with at least one of the drift regions. As a result, it is possible to prevent the entirety of the channel region from becoming low concentration, thus mitigating a decrease in channel mobility.

Having the first withstand voltage maintaining regions and the first diffusion region together in the channel region does not result in many more manufacturing steps compared to a conventional configuration. The first diffusion region simply needs to be formed in a region for another element different from the field effect transistor region in the step of forming the impurity regions at the same concentration as the first diffusion region, for example. The same mask layer may be shared in forming the first diffusion region as when doping the region for another element, and thus, an increase in the number of manufacturing steps can be avoided. The first withstand voltage maintaining region may be formed by having a portion of the semiconductor layer formed prior to doping delineate the first diffusion region from the drift regions. In other words, the first withstand voltage maintaining regions are portions of the original semiconductor layer. In such a case, no additional mask layer is used when forming the first withstand voltage maintaining regions.

According to another aspect of the present invention, second diffusion regions of the first conductive type formed directly under at least the drift regions and having a concentration higher than the semiconductor layer may be further included.

According to this configuration, the dependence of the source/drain withstand voltage on the thickness of the semiconductor layer can be reduced. Thus, even if there are variations in thickness of the semiconductor layer in the manufacturing process, the variation in withstand voltage resulting from variation in thickness can be made less than the variation in thickness. As a result, it is possible to more effectively stabilize the source/drain withstand voltage.

In this configuration, it is preferable that the second diffusion region be a diffusion region with a higher concentration than the first diffusion region.

According to another aspect of the present invention, the second diffusion regions may be formed at a gap from the drift regions.

According to this configuration, it is possible to interpose second withstand voltage maintaining regions of a first conductive type that are portions of the semiconductor layer and that have a lower concentration than the second diffusion regions between the second diffusion regions and the drift region.

According to another aspect of the present invention, the first diffusion region may be formed at a depth greater than the drift regions, and the second diffusion regions may be formed across an area at a depth that is the same as the bottom of the first diffusion region in a thickness direction of the semiconductor layer.

According to this configuration, it is possible to delineate a prescribed region as the semiconductor layer by the first diffusion region and the second diffusion regions, thus allowing the drift regions to be disposed in the prescribed region.

According to another aspect of the present invention, the second diffusion regions may have the same pattern as the drift regions.

According to this configuration, the second diffusion regions can be formed with the same mask layer as when doping the drift regions, and thus, an increase in the number of manufacturing steps can be avoided when forming the second diffusion regions.

According to another aspect of the present invention, the first diffusion region may be formed at gaps from both the drift regions.

According to this configuration, both of the pair of drift regions have a p-n junction formed with the respective first withstand voltage maintaining regions, and thus, the source/drain withstand voltage can be further increased in a stable manner.

According to another aspect of the present invention, the semiconductor device may further include an embedded region (embedded layer) of the second conductive type embedded in the semiconductor layer so as to cause the field effect transistor region to be electrically floating as a well of the first conductive type.

In this case, it is preferable that the semiconductor device further include a guard ring of the second conductive type formed in the surface of the semiconductor layer so as to surround the well of the first conductive type, wherein the embedded region includes, as one example, a relatively high concentration base portion that separates the well of the first conductive type from an area therebelow, and a side portion that has a lower concentration than the base portion and that contacts the guard ring so as to separate the well of the first conductive type from an area to the side thereof, the base portion and the side portion being formed integrally with each other.

According to this configuration, the base portion has a higher concentration than the side portions, and thus, latchup in the semiconductor device can be mitigated.

According to another aspect of the present invention, a well contact region of the first conductive type formed in the surface of the semiconductor layer in the well of the first conductive type; and a third diffusion region of the first conductive type formed so as to contact the well contact region, the third diffusion region having the same concentration and depth as the first diffusion region may be further included.

According to this configuration, the third diffusion region has the same concentration and depth as the first diffusion region, and thus, it is possible to form the third diffusion region in the same manufacturing step as the first diffusion region.

In this case, the third diffusion region may be formed so as to contact the side portion of the embedded region.

According to another aspect of the present invention, a substrate contact region of the first conductive type formed in the surface of the semiconductor layer in a region opposite to the well of the first conductive type across a side portion of the embedded region; and a fourth diffusion region of the first conductive type formed to contact the substrate contact region, the fourth diffusion region having a higher concentration than the semiconductor layer may be further included.

According to this configuration, it is possible to stably improve not only the source/drain withstand voltage but also the withstand voltage between the first conductive type well and the substrate contact region (well/substrate withstand voltage).

Also, in this configuration, if first conductive type second diffusion regions having a higher concentration than the semiconductor layer are additionally formed directly below the drift regions, it is also possible to reduce the dependence of the well/substrate withstand voltage on the thickness of the semiconductor layer.

The fourth diffusion region may be formed at a gap from the embedded region.

Also, the field effect transistor region may be a high withstand voltage transistor region having a withstand voltage of 35V to 45V.

The present invention can stably improve the source/drain withstand voltage as described above, and thus, is suited to such high withstand voltage transistors.

According to another aspect of the present invention, a region for another element selectively formed in the semiconductor layer may be further included, the region for another element being different from the field effect transistor region, wherein the region for another element has formed therein a fifth diffusion region of the first conductive type having the same concentration and depth as the first diffusion region.

According to this configuration, the fifth diffusion region has the same concentration and depth as the first diffusion region, and thus, it is possible to form the fifth diffusion region in the same manufacturing step as the first diffusion region.

Another aspect of the present invention provides a method of manufacturing a semiconductor device, including: forming a pair of drift regions with a gap therebetween by selectively implanting an impurity of a second conductive type into a field effect transistor region of a semiconductor layer of a first conductive type, the semiconductor layer having selectively formed therein the field effect transistor region and a region for another element different from the field effect transistor region; forming a source region in one drift region and forming a drain region in another drift region by selectively implanting the impurity of the second conductive type into the pair of drift regions; forming a first diffusion region with a higher concentration than the semiconductor layer so as to form a gap with at least one of the drift regions in a channel region located between the pair of drift regions, and simultaneously forming the fifth diffusion region at the same concentration and depth as the first diffusion region in the region for another element, by selectively implanting an impurity of the first conductive type into the channel region and the region for another element; and forming a gate insulating film on the surface of the semiconductor layer over the channel region and a gate electrode on the gate insulating film so as to face the channel region.

According to this method, it is possible to form the first diffusion region formed in the field effect transistor region and the fifth diffusion region formed in a region for another element in the same manufacturing step. As a result, it is possible to manufacture a semiconductor device having a semiconductor layer in common between a field effect transistor having the above-mentioned effect and another semiconductor element, while preventing an increase in the number of manufacturing steps.

Another aspect of the present invention may further include forming, prior to the step of forming the drift regions, second diffusion regions at a greater depth than the drift regions by selectively implanting the impurity of the first conductive type in the field effect transistor region through an ion implantation mask used when forming the drift regions.

According to this configuration, the second diffusion regions can be formed with the same mask layer (ion implantation mask) as when doping the drift regions, and thus, an increase in the number of manufacturing steps can be avoided when forming the second diffusion regions. The second diffusion regions and drift regions can be formed by the same ion implantation mask.

According to another aspect of the present invention, the method of manufacturing a semiconductor device may further include: forming on a surface of a semiconductor substrate of the first conductive type the semiconductor layer having a base portion by implanting the impurity of the second conductive type in a portion of the surface of the semiconductor substrate corresponding to where the base portion is to be formed and then growing by epitaxial growth the semiconductor layer from the surface of the semiconductor substrate, the base portion being selectively embedded in an area below the field effect transistor region between the semiconductor substrate and the semiconductor layer; and forming on sides of the field effect transistor region a side portion that is at a lower concentration than the base portion and that is integral with the base portion so as to cause the field effect transistor region to be electrically floating as the well of the first conductive type, by selectively implanting the impurity of the second conductive type in a region of the semiconductor layer surrounding the field effect transistor region.

According to another aspect of the present invention, in the method of manufacturing a semiconductor device, the step of forming the first diffusion region may further include: forming a third diffusion region of the first conductive type at the same concentration and depth as the first diffusion region simultaneously to the well of the first conductive type; and forming a well contact region in the surface of the semiconductor layer by selectively implanting the impurity of the first conductive type in the third diffusion region.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Below, embodiments of the present invention will be explained in detail with reference to appended drawings.

Figure 1:
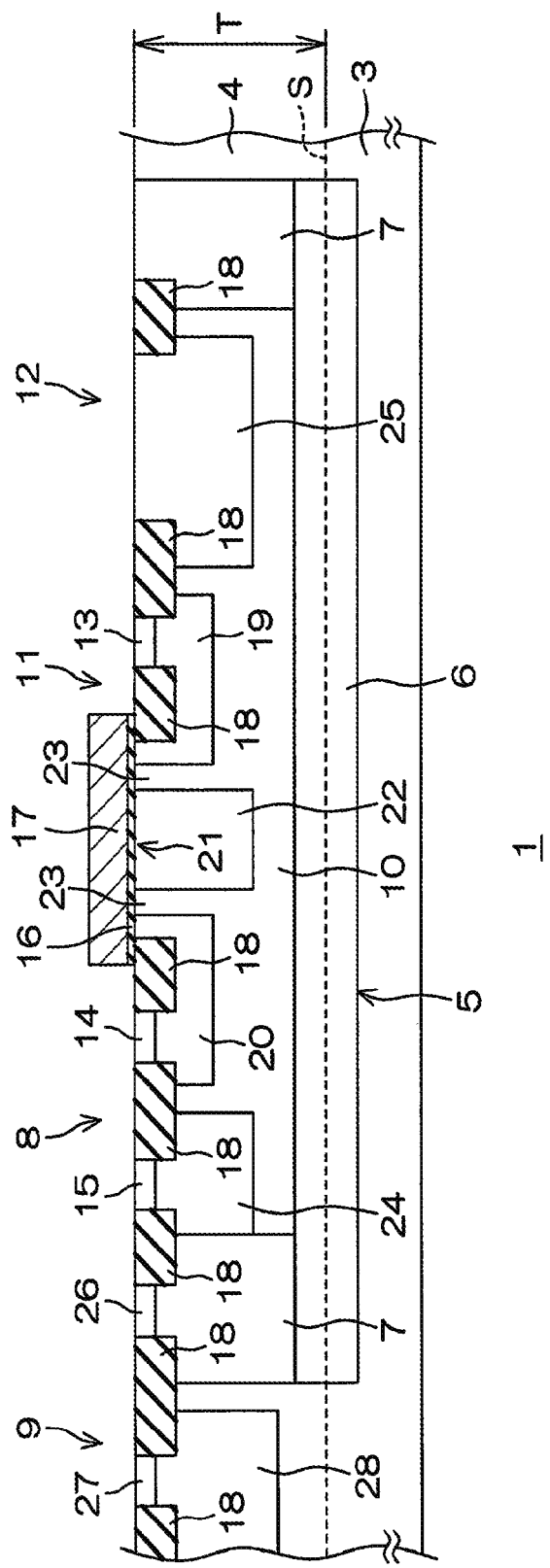
FIG. 1 is a cross-sectional view of a semiconductor device according to Embodiment 1 of the present invention.

FIG. 1 is a cross-sectional view of a semiconductor device 1 according to Embodiment 1 of the present invention.

A semiconductor device 1 includes a semiconductor substrate 3 and an epitaxial layer 4 as an example of a semiconductor layer of the present invention formed on the semiconductor substrate 3. In the present embodiment, the epitaxial layer 4 is formed by epitaxial growth of silicon including a p-type impurity on the semiconductor substrate 3 that is a silicon substrate.

The semiconductor substrate 3 has a p-type impurity concentration of $7.0 \times 10^{14}/cm^3$ to $1.3 \times 10^{15}/cm^3$, with the thickness thereof being 80 μm to 120 μm, for example. The epitaxial layer 4 has a p-type impurity concentration $1.7 \times 10^{15}/cm^3$ to $2.3 \times 10^{15}/cm^3$, with a thickness T being 6.5 μm to 7.5 μm, for example. The total thickness including the thickness of the semiconductor substrate 3 and the thickness T of the epitaxial layer 4 is 86.5 μm to 127.5 μm, for example.

The semiconductor substrate 3 and the epitaxial layer 4 has embedded therein an embedded layer 5 including an n-type impurity. The embedded layer 5 includes a relatively high concentration base portion 6 that is formed along a direction perpendicular to the thickness direction of the epitaxial layer 4, and a relatively low concentration side portion 7 that is formed on the edge of the base portion 6 so as to surround the inner region of the base portion 6.

The base portion 6 of the embedded layer 5 is formed so as to straddle a boundary face S between the semiconductor substrate 3 and the epitaxial layer 4. In other words, the base portion 6 is formed on both sides of the boundary face S in the thickness direction of the epitaxial layer 4. The n-type impurity concentration of the base portion 6 is $1.0 \times 10^{17}/cm^3$ to $2.0 \times 10^{17}/cm^3$, for example.

Also, the side portion 7 of the embedded layer 5 extends from the surface of the epitaxial layer 4 in the thickness direction thereof and is formed integrally with the upper portion of the base portion 6. The n-type impurity concentration of the side portion 7 is $1.0 \times 10^{16}/cm^3$ to $2.0 \times 10^{16}/cm^3$, for example.

The epitaxial layer 4 is divided by the embedded layer 5 into an active region 8 surrounded by the embedded layer 5 and an outer region 9 that is to the outside of the active region 8. The active region 8 has a p-type well region 10 that is electrically floating from the outer region 9. The p-type well region 10 is a portion of the epitaxial layer 4 and has the same p-type impurity concentration as the epitaxial layer 4.

The active region 8 includes a first transistor region 11 in which a MOSFET (metal-oxide-semiconductor field-effect transistor) is formed, and a second transistor region 12 that is an element region where a semiconductor element is formed.

The first transistor region 11 includes a first source region 13, a first drain region 14, and a well contact region 15, which are selectively formed on the surface of the epitaxial layer 4 at gaps from each other, and a first gate electrode 17 formed over a first gate insulating film 16 between the first source region 13 and the first drain region 14.

The first source region 13 and the first drain region 14 both have a conductive type of n, and both are formed at the same concentration and same depth. The n-type impurity concentration of the first source region 13 and the first drain region 14 is $1.0 \times 10^{21}/cm^3$ to $2.0 \times 10^{21}/cm^3$, for example. Also, the first source region 13 and the first drain region 14 are individually surrounded by element separators 13 that respectively include an insulating material. The element separators 18 are formed so as to extend in the thickness direction from the surface of the p-type well region 10, and the bottoms of the element separators 18 are at a greater depth than the bottoms of the first source electrode 13 and the first drain electrode 14.

To form the element separators 18 of the present embodiment, a LOCOS (local oxidation of silicon) film formed by selectively oxidizing the surface of the epitaxial layer 4, STI (shallow trench isolation) in which an insulating material is embedded in a plurality of trenches formed selectively in the epitaxial layer 4, or the like can be used, for example.

The first transistor region 11 additionally includes a first source drift region 19 formed to surround the first source region 13, and a first drain drift region 20 that forms a pair with the first source drift region 19 and that is formed to surround the first drain region 14. The first source drift region 19 and the first drain drift region 20 both have a conductive type of n, and both are formed at the same concentration and same depth. The n-type impurity concentration of the first source drift region 19 and the first drain drift region 20 is $1.0 \times 10^{17}/cm^3$ to $2.0 \times 10^{17}/cm^3$, for example.

In the present embodiment, the first source drift region 19 is formed so as to surround the element separator 18 that surrounds the first source region 13. More specifically, the first source drift region 19 surrounds the element separator 18 and reaches the surface of the epitaxial layer 4 in a region outside the element separator 18. The first source drift region 19 may surround the entire element separator 18, or, as shown in FIG. 1, selectively surround a portion of the element separator 18 towards the first gate electrode 17. The portion of the first source drift region 19 that does not surround the element separator 18 may be formed on the bottom of the element separator 18, for example.

In the present embodiment, the first drain drift region 20 is formed so as to surround the element separator 18 that surrounds the first drain region 14. More specifically, the first drain drift region 20 surrounds the element separator 18 and reaches the surface of the epitaxial layer 4 in a region outside the element separator 18. The first drain drift region 20 may surround the entire element separator 18, or, as shown in FIG. 1, selectively surround a portion of the element separator 18 towards the first gate electrode 17. The portion of the first drain drift region 20 that does not surround the element separator 18 may be formed on the bottom of the element separator 18, for example.

The first source drift region 19 and the first drain drift region 20 are formed at a gap from each other in a direction along the surface of the epitaxial layer 4, and a first channel region 21 for the MOSFET is formed in this gap.

In the first channel region 21, a p-type first diffusion region 22 with a higher concentration than the epitaxial layer 4 (p-type well region 10) is formed at a gap from the first source drift region 19 and the first drain drift region 20. The p-type impurity concentration of the first diffusion region 22 is $1.0 \times 10^{16}/cm^3$ to $2.0 \times 10^{16}/cm^3$, for example. The first diffusion region 22 extends from the surface of the epitaxial layer 4 in the thickness direction such that the bottom of the first diffusion region 22 is above the base portion 6 of the embedded layer 5, with a gap therebetween. The bottom of the first diffusion region 22 is formed at a greater depth than the bottoms of the first source drift region 19 and the first drain drift region 20.

In the region between the first diffusion region 22 and the first source drift region 19 and the region between the first diffusion region 22 and the first drain drift region 20, first withstand voltage maintaining regions 23 are respectively formed. The first withstand voltage maintaining regions 23 are portions of the p-type well region 10, and the p-type impurity concentration of the first withstand voltage maintaining regions 23 is lower than that of the first diffusion region 22. Between the first source drift region 19 and the first withstand voltage maintaining region 23 and between the first drain drift region 20 and the first withstand voltage maintaining region 23, p-n junctions are formed.

The well-contact region 15 is formed so as to surround the element separator 18 between the side portion 7 of the embedded layer 5 and the first drain region 14. The well contact region 15 has a p-type conductivity, and is formed at the same depth as the first source region 13 and the first drain region 14. The p-type impurity concentration of the well contact region 15 is $1.0 \times 10^{20}/cm^3$ to $2.0 \times 10^{20}/cm^3$, for example.

The element separator 18 surrounding the well contact region 15 is formed integrally with the element separator 18 surrounding the first drain region 14. In other words, the well contact region 15 and the first drain region 14 are separated by the element separator 18 shared therebetween, and face each other across the element separator 18.

In the area below the well contact region 15, a third diffusion region 24 is formed at the same concentration and depth as the first diffusion region 22. The third diffusion region 24 is formed so as to extend in the thickness direction of the epitaxial layer 4 from the bottom of the element separator 18 surrounding the well contact region 15. In other words, the third diffusion region 24 is formed further inside than the element separator 18 surrounding the well contact region 15 in a cross-sectional view. At this time, the side face of the third diffusion region 24 facing the outer region 9 is formed so as to be in contact with the side portion 7 of the embedded layer 5.

By contrast, the side face of the third diffusion region 24 facing the active region 8 is formed at a gap from the first drain drift region 20. In other words, the third diffusion region 24 is formed so as to face the first drain drift region 20 across the p-type well region 10. The distance of the gap between the third diffusion region 24 and the first drain drift region 20 is the same as the distance of the respective gaps between the first diffusion region 22 and the first source drift region 19 and between the first diffusion region 22 and the first drain drift region 20, for example.

The first gate electrode 17 is formed over the surface of the epitaxial layer 4 across the first gate insulating film 16 so as to face the first channel region 21. The first gate insulating film 16 is formed on the p-type well region 10 across the boundary between the first source drift region 19 and the first withstand voltage maintaining region 23, the boundary between the first drain drift region 20 and the first withstand voltage maintaining region 23, and the boundary between the first withstand voltage maintaining region 23 and the first diffusion region 22. As a configuration that differs from the configuration above, the first gate insulating film 16 may be formed on the p-type well region 10 so as to be integral with the element separators 18 disposed towards the first channel region 21 among the element separators 18 that respectively surround the first source region 13 and the first drain region 14. In this manner, a MOSFET is formed in the first transistor region 11.

The second transistor region 12 where the semiconductor element is formed includes a fifth diffusion region 25 formed at the same concentration and depth as the first diffusion region 22. The fifth diffusion region 25 is formed so as to extend in the thickness direction of the epitaxial layer 4 from the bottom of the element separator 18 surrounding the first source region 13. The side face of the fifth diffusion region 25 facing the active region 8 is formed at a gap from the edge of the first source drift region 19 on the bottom of the element separator 18 formed opposite to the first gate electrode 17 among the element separators 18 surrounding the first source region 13. The distance of the gap between the fifth diffusion region 25 and the first source drift region 19 is the same as the distance between the respective gaps of the first diffusion region 22 and the first source drift region 19 and the first diffusion region 22 and the first drain drift region 20, for example.

Examples of the second transistor region 12 include second transistor regions having formed therein a MOSFET, an IGBT (insulated gate bipolar transistor), or the like, a diode region in which a diode is formed, or the like, depending on the element formed in the second transistor region 12, but the second transistor region 12 is not limited thereto. Thus, as long as a semiconductor element including the fifth diffusion region 25 is formed at the same concentration and thickness as the first diffusion region 22, there is no limit on the element to be formed in the second transistor region.

A guard ring region 26 is formed in the outer region 9 so as to surround the element separator 18 on the side portion 7 of the embedded layer 5. The guard ring region 26 has an n-type conductivity, and is formed at the same concentration and depth as the first source region 13 and the first drain region 14.

On the surface of the epitaxial layer 4 in the outer region 9, a substrate contact region 27 is selectively formed so as to surround the element separator 18. The substrate contact region 27 has a p-type conductivity, and is formed at the same concentration and depth as the well contact region 15.

A fourth diffusion region 28 having a higher concentration than the first diffusion region 22 is formed in a region below the substrate contact region 27. The n-type impurity concentration of the fourth diffusion region 28 is $4.0 \times 10^{17}/cm^3$ to $5.0 \times 10^{17}/cm^3$, for example. The fourth diffusion region 28 is formed so as to extend in the depth direction of the epitaxial layer 4 from the bottom of the element separator 18 surrounding the substrate contact region 27. At this time, the fourth diffusion region 28 may be formed at a greater depth than the first diffusion region 22.

The fourth diffusion region 28 is formed at a gap from the side portion 7 of the embedded layer 5 so as to face the side portion 7 of the embedded layer 5 across the epitaxial layer 4. The distance between the fourth diffusion region 28 and the side portion 7 of the embedded layer 5 is the same as the distance between the first diffusion region 22 and the first source drift region 19, for example.

Next, the manufacturing process for the semiconductor device 1 will be described with reference to FIGS. 2A to 2G.

FIGS. 2A to 2G are cross-sectional views of one example of the manufacturing steps of the semiconductor device 1 in FIG. 1 in order.

Figure 2A:
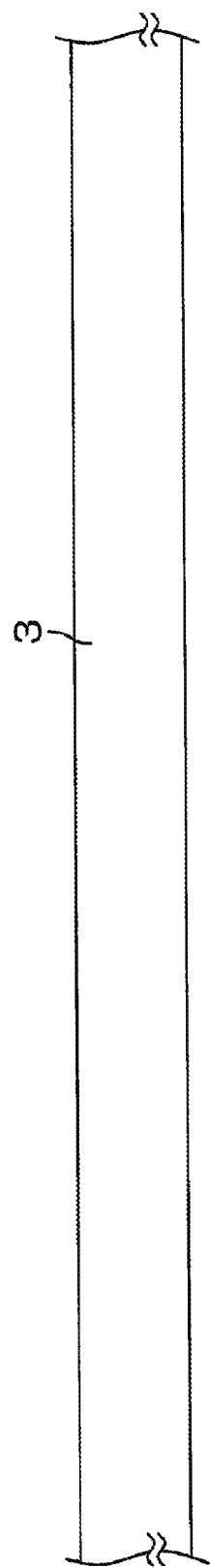
FIG. 2A is a cross-sectional view for describing a manufacturing step of the semiconductor device in FIG. 1.

In order to manufacture the semiconductor device 1, as shown in FIG. 2A, the semiconductor substrate 3 is prepared, for example.

Figure 2B:
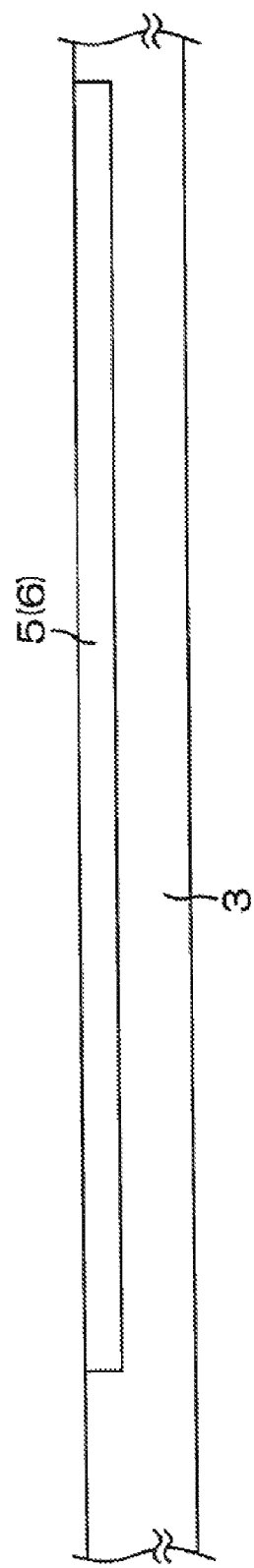
FIG. 2B is a view showing the next manufacturing step after FIG. 2A.

Next, an ion implantation mask (not shown), which has openings formed selectively in regions where the base portion 6 of the n-type embedded layer 5 is to be formed, is formed on the semiconductor device 3. Then, the semiconductor substrate 3 is doped with arsenic (As) ions as the n-type impurity ions through the ion implantation mask, thus forming the n-type embedded layer 5 as shown in FIG. 2B. After the embedded layer 5 is formed, the ion implantation mask (not shown) is removed.

Figure 2C:
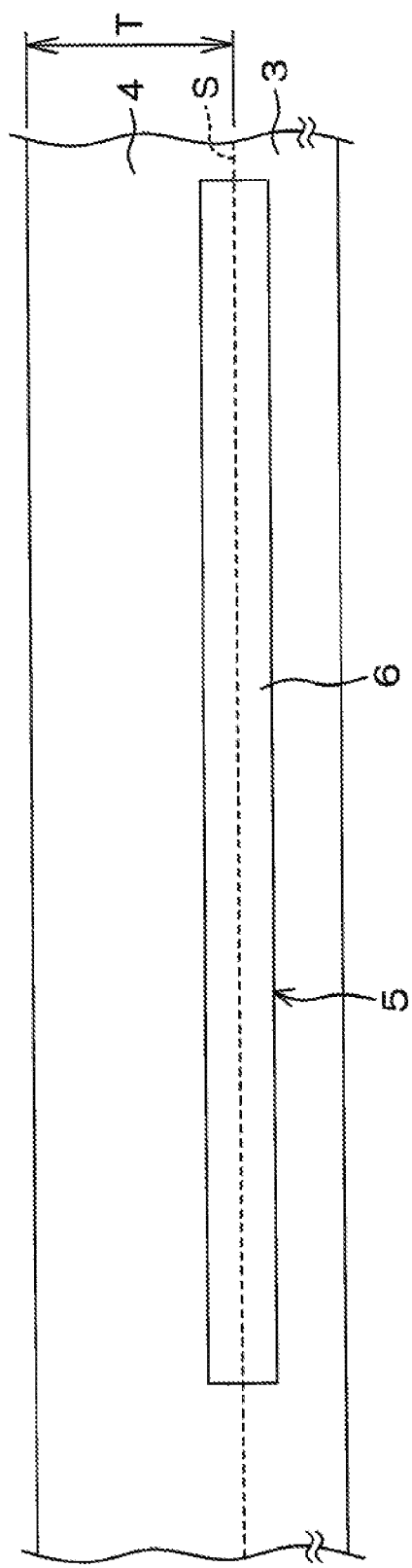
FIG. 2C is a view showing the next manufacturing step after FIG. 2B.

Next, as shown in FIG. 2C, epitaxial growth is performed while implanting boron (B) ions as the p-type impurity, thus forming the epitaxial layer 4. Epitaxial growth is performed until the epitaxial layer 4 is at a thickness T of 6.5 μm to 7.5 μm, for example. At this time, the base portion 6 of the embedded layer 5 spreads in the growth direction from the surface of the semiconductor substrate 3. In this manner, the base portion 6 of the embedded layer 5 straddling the boundary face S between the semiconductor substrate 3 and the epitaxial layer 4 is formed.

Next, the element separators 18 are selectively formed on the epitaxial layer 4. More specifically, the element separators 18 are selectively formed so as to surround the respective regions where the first source region 13, the first drain region 14, and the well contact region 15 of the first transistor region 11, and the fifth diffusion region 25 and guard ring region 26 on the side portion 7 of the embedded layer 5 in the second transistor region 12 are to be formed.

The element separator 18 may be a LOCOS film or STI, for example. If the element separator 18 is a LOCOS film, then it is possible to form the LOCOS film by forming a resist mask (not shown) having openings that selectively expose the surface of the epitaxial layer 4, and then oxidizing the surface of the epitaxial layer 4, for example. If the element separator 18 is STI, then it is possible to form the STI by selectively forming trenches in the epitaxial layer 4 and filling the trenches with an insulating material, for example.

Figure 2D:
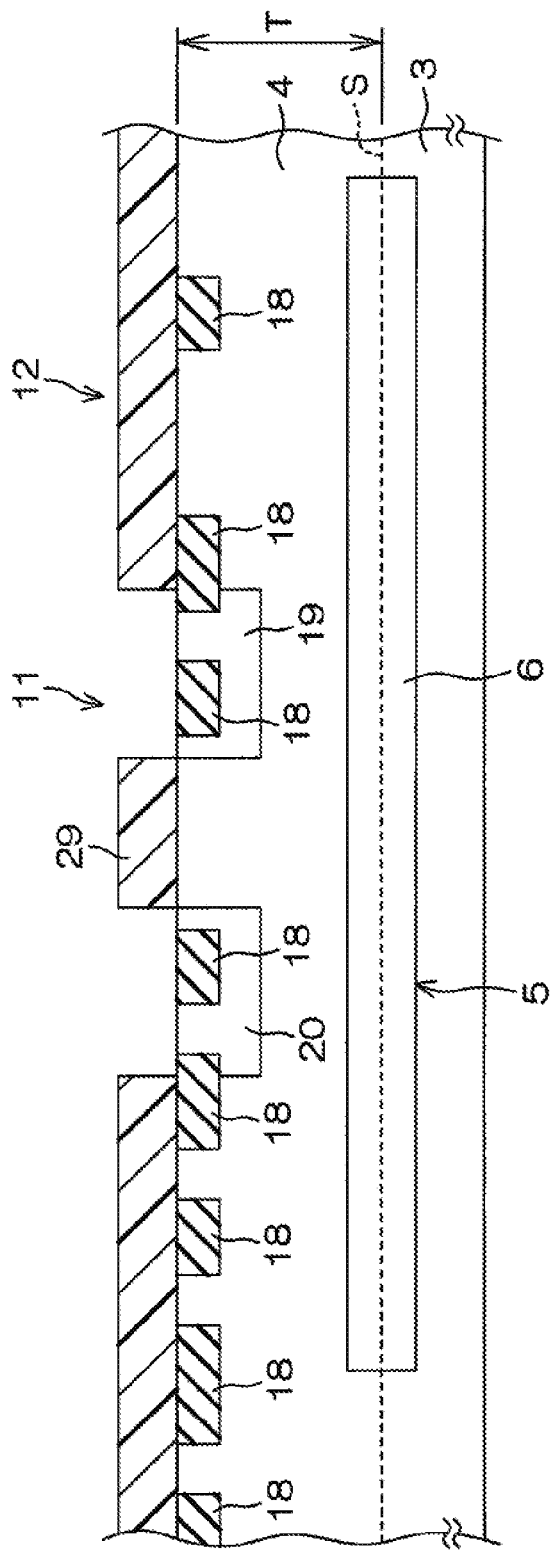
FIG. 2D is a view showing the next manufacturing step after FIG. 2C.

Next, as shown in FIG. 2D, an ion implantation mask 29, which has openings selectively formed in regions where the first source drift region 19 and the first drain drift region 20 are to be formed, is formed on the epitaxial layer 4. Then, n-type impurity ions are implanted through the openings of the ion implantation mask 29, thus forming the first source drift region 19 and the first drain drift region 20. After the first source drift region 19 and the first drain drift region 20 are formed, the ion implantation mask 29 is removed.

Figure 2E:
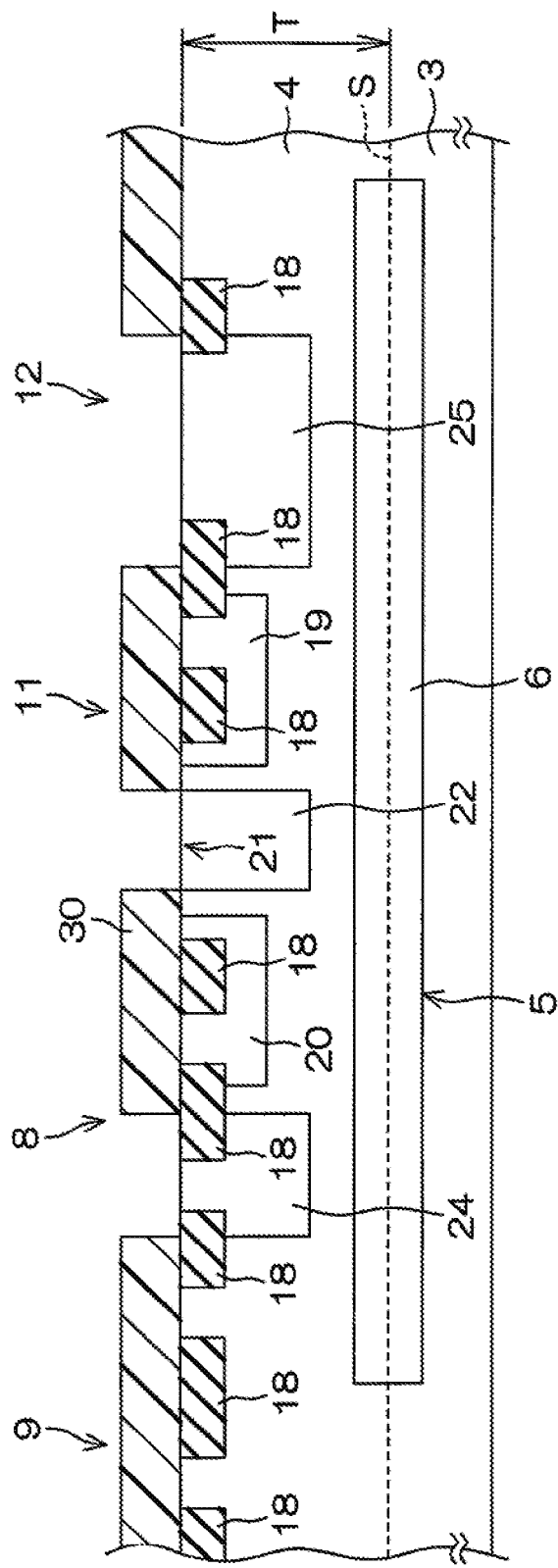
FIG. 2E is a view showing the next manufacturing step after FIG. 2D.

Next, as shown in FIG. 2E, in the first transistor region 11 and the second transistor region 12, an ion implantation 30, which has openings selectively formed in regions where the first, third, and fifth diffusion regions 22, 24, and 25 are to be formed, is formed. Then, boron (B) ions as the p-type impurity are implanted through the openings in the ion implantation mask 30 so as to achieve a higher concentration than in the epitaxial layer 4, thus simultaneously forming the first, third, and fifth diffusion regions 22, 24, and 25, for example. The conditions for implanting the p-type impurity are that the doping energy is 160 keV to 200 keV, with a dose of $5.4 \times 10^{11}/cm^2$ to $6.6 \times 10^{11}/cm^2$, for example.

At this time, the first diffusion region 22 and the third diffusion region 24 are formed at substantially equal gaps from the first source drift region 19 and the first drain drift region 20. The first, third, and fifth diffusion regions 22, 24, and 25 are formed at a greater depth than the first source drift region 19 and the first drain drift region 20. After the first, third, and fifth diffusion regions 22, 24, and 25 are formed, the ion implantation mask 30 is removed.

Next, an ion implantation mask (not shown), which has an opening selectively formed in the region where the fourth diffusion region 28 is to be formed, is formed. Then, boron (B) ions as the p-type impurity are implanted through the ion implantation mask so as to achieve a higher concentration than the first, third, and fifth diffusion region 22, 24, and 25. Thus, the fourth diffusion region 28 is formed. At this time, the fourth diffusion region 28 may be formed at a greater depth than the first, third, and fifth diffusion regions 22, 24, and 25. After the fourth diffusion region 28 is formed, the ion implantation mask (not shown) is removed.

Figure 2F:
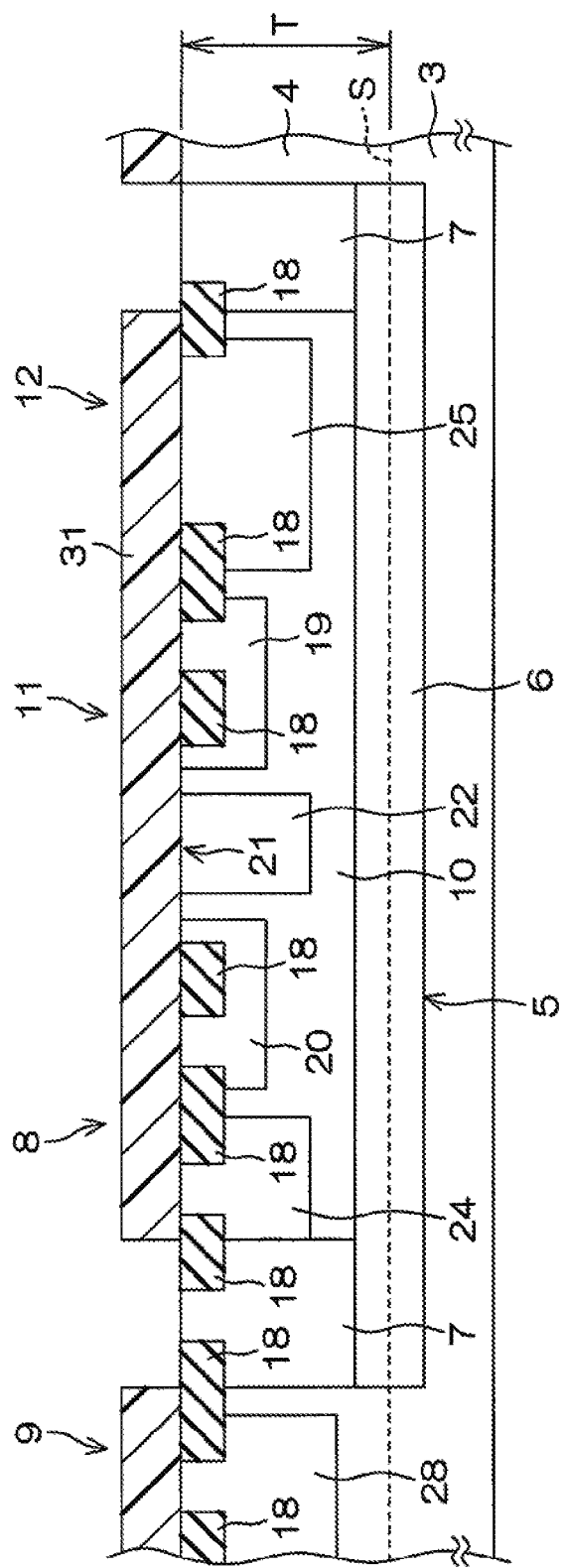
FIG. 2F is a view showing the next manufacturing step after FIG. 2E.

Next, as shown in FIG. 2F, an ion implantation mask 31, which has openings selectively formed in the regions where the side portion 7 of the embedded layer 5 is to be formed, is formed. Then, phosphorus (P) ions as the n-type impurity are implanted through the ion implantation mask 31 so as to achieve a lower concentration than in the embedded layer 5. The conditions for implanting the n-type impurity are that the doping energy is 1800 keV to 2000 keV, with a dose of $3.1 \times 10^{12}/cm^2$ to $3.7 \times 10^{12}/cm^2$, for example.

At this time, the side portion 7 of the embedded layer 5 is formed by the n-type impurity extending in the thickness direction of the epitaxial layer 4 from the surface thereof, and the side portion 7 is formed integrally with the base portion 6 of the embedded layer 5. As a result, the embedded layer 5 includes integrally the relatively high concentration base portion 6 that separates the p-type well region 10 from the area therebelow, and the low concentration side portion 7 that separates the p-type well region 10 from the areas to the side thereof.

In addition, at this time, the side portion 7 of the embedded layer 5 is formed at a gap from the fourth diffusion region 28 while being in contact with the third diffusion region 24. The distance of the gap between the side portion 7 of the embedded layer 5 and the fourth diffusion region 28 is substantially the same as distance of the respective gaps between the first diffusion region 22 and third diffusion region 24, and the first source drift region 19 and the first drain drift region 20, for example. After the side portion 7 of the embedded layer 5 is formed, the ion implantation mask 31 is removed. A step in which the fourth diffusion region 28 is formed before the side portion 7 of the embedded layer 5 was described, but a step in which the side portion 7 of the embedded layer 5 is formed before the fourth diffusion region 28 may be used.

Figure 2G:
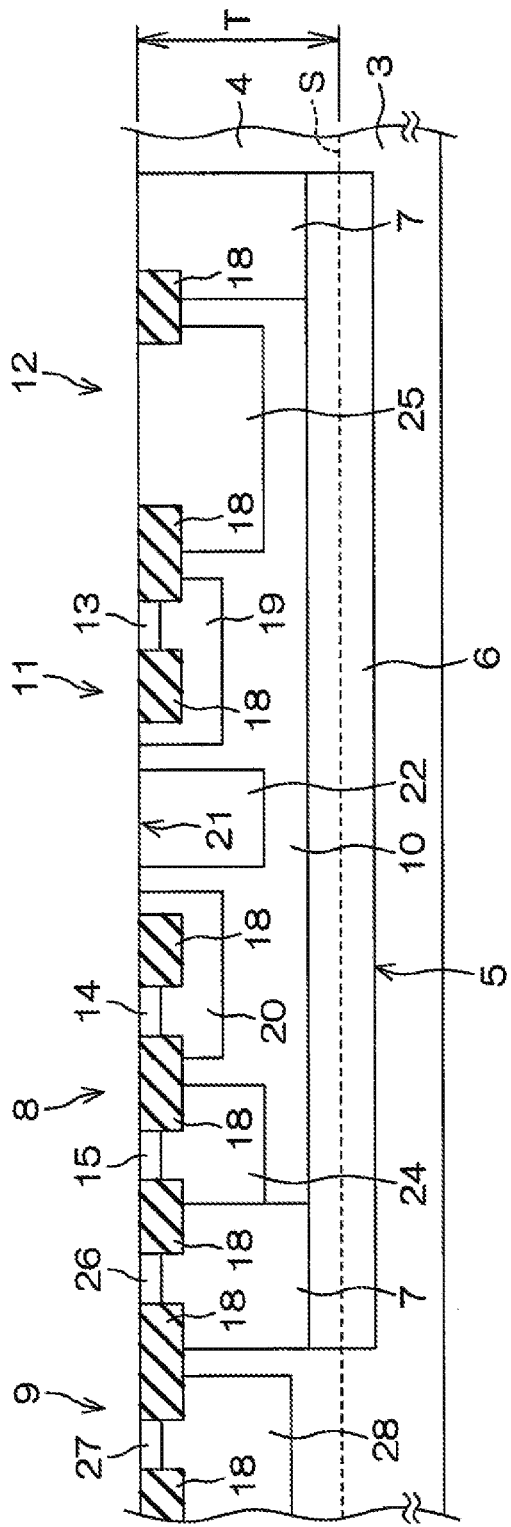
FIG. 2G is a view showing the next manufacturing step after FIG. 2F.

Next, as shown in FIG. 2G, an ion implantation mask (not shown), which has openings selectively formed where the first source region 13 and the first drain region 14 in the first transistor region 11, and the guard ring region 26 on the side portion 7 of the embedded layer 5 are to be formed, is formed, and an n-type impurity is implanted at the same concentration and depth through these openings. As a result, the first source region 13 and the first drain region 14, and the guard ring region 26 are formed simultaneously so as to be surrounded by the element separators 18. Then, the ion implantation mask (not shown) is removed.

Similarly, an ion implantation mask (not shown) having openings selectively formed therein where the well contact region 15 in the first transistor region 11 is to be formed and where the substrate contact region 27 in the outer region 9 is to be formed, and a p-type impurity is implanted at the same concentration and thickness through these openings. As a result, the well contact region 15 and the substrate contact region 27 are formed simultaneously so as to be surrounded by the element separators 18. Then, the ion implantation mask (not shown) is removed.

Next, in the first transistor region 11, the first gate electrode 17 is formed over the first gate insulating film 16 so as to face the first channel region 21. The semiconductor device 1 as shown in FIG. 1 is obtained by the steps above.

Next, the withstand voltage between the first source region 13 and the first drain region 14 (source/drain withstand voltage) and the withstand voltage between the well contact region 15 and the substrate contact region 27 (well/substrate withstand voltage) will be described.

Based on the semiconductor device 1 of FIG. 1, the thickness T of the epitaxial layer 4 was changed in a simulation, and the withstand voltages between the respective regions were studied under various conditions. The tests done by simulation were conducted with the MOSFET in the first transistor region 11 being OFF, and with the thickness T being changed in order between 7 µm, 6 µm, and 5 µm. The thickness of the semiconductor substrate 3 remained the same.

In this case, a sweep voltage that was gradually increased from 0.0V was applied to the first drain region 14 until the first transistor region 11 underwent breakdown. Meanwhile, the first gate electrode 17, the first source region 13, the well contact region 15, the guard ring region 26, and the substrate contact region 27 were fixed at ground potential.

According to the simulation results, the source/drain withstand voltage was 45.0V when the thickness T was 7 µm, 31.0V when the thickness T was 6 µm, and 20.0V when the thickness T was 5 µm.

Also, the well/substrate withstand voltage was 51.0V when the thickness T was 7 µm, 14.5V when the thickness T was 6 µm, and 5.3V when the thickness T was 5 µm.

By contrast, when studying, as a reference example, the withstand voltage of an actual epitaxial wafer (thickness T=7 µm) in which the entire p-type well region 10 was formed at the same concentration as the first diffusion region 22, the source/drain withstand voltage was 30.5V.

As described above, according to the configuration of Embodiment 1 of the present invention, p-n junctions are formed between the first source drift region 19 and the first withstand voltage maintaining region 23 and between the first drain drift region 20 and the first withstand voltage maintaining region 23, the first withstand voltage maintaining region 23 being a portion of the epitaxial layer 4. Thus, compared to a situation in which p-n junctions are formed with a relatively high concentration p-type region, it is possible to stably increase the source/drain withstand voltage.

More specifically, as clear from the study results above, when the thickness T of the epitaxial layer is 7 μm, whereas the source/drain withstand voltage of the reference example is 30.5V, the source/drain withstand voltage of the semiconductor device 1 of the present embodiment is 45.0V. In other words, the source/drain withstand voltage of the semiconductor device 1 is approximately 1.5 times greater than the withstand voltage of the reference example.

In the area below the well contact region 15 and the area below the substrate contact region 27, the third diffusion region 24 and the fourth diffusion region 28, which are at a higher concentration than the epitaxial layer 4, are formed, and thus, not only the source/drain withstand voltage but also the well/substrate withstand voltage can be stably improved.

The first withstand voltage maintaining region 23 is formed not in the entire first channel region 21 but selectively at junctions with the first source drift region 19 and the first drain drift region 20, and in the gap between the first source drift region 19 and the first drain drift region 20, a first diffusion region 22 with a higher concentration than the p-type well region 10 is formed. As a result, it is possible to prevent the entirety of the first channel region 21 from becoming low concentration, thus mitigating a decrease in channel mobility.

Also, in the epitaxial layer 4, the base portion 6 is formed at a higher concentration than the side portion 7 of the embedded layer 5, and thus, it is possible to mitigate latchup in the semiconductor device 1.

Also, the first, third, and fifth diffusion regions 22, 24, and 25 can be formed simultaneously, and thus, it is possible to form the first transistor region 11 and the second transistor region 12, which are different regions, simultaneously, while preventing an increase in the number of manufacturing steps.

Next, a semiconductor device 32 of Embodiment 2 of the present invention will be explained with reference to FIG. 3.

Figure 3:
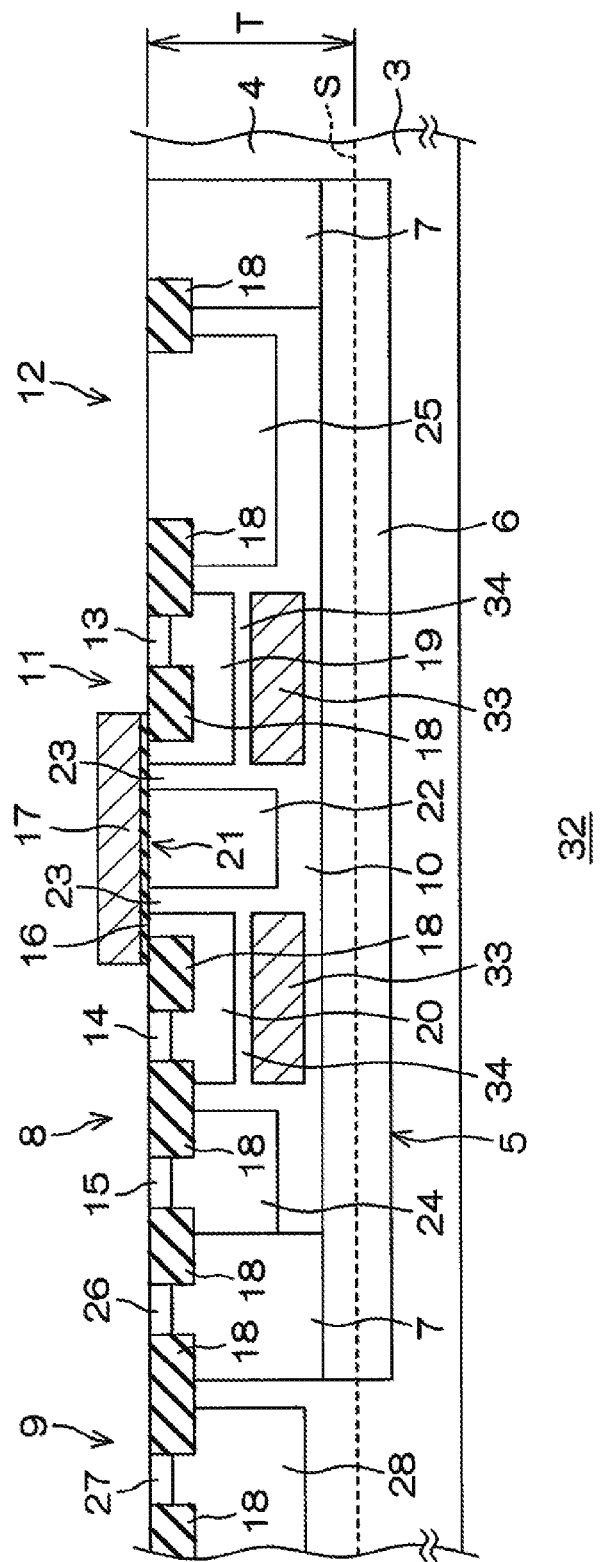
FIG. 3 is a cross-sectional view of a semiconductor device according to Embodiment 2 of the present invention.

FIG. 3 is a cross-sectional view of a semiconductor device 32 according to Embodiment 2 of the present invention.

The difference between the semiconductor device 32 and the previously described semiconductor device 1 of Embodiment 1 is that second diffusion regions 33 are formed directly below the first source drift region 19 and the first drain drift region 20. Other configurations are similar to those of Embodiment 1. In FIG. 3, portions corresponding to the portions in FIGS. 1 to 2G are assigned the same reference characters and descriptions thereof will be omitted.

The second diffusion regions 33 have a higher p-type impurity concentration than the epitaxial layer 4. The impurity concentration of the second diffusion regions 33 is $2.0 \times 10^{16}/cm^3$ to $3.0 \times 10^{16}/cm^3$, for example. In this case, it is preferable that the second diffusion regions 33 have a higher impurity concentration than the first, third, and fifth diffusion regions 22, 24, and 25.

The second diffusion regions 33 are formed in the same pattern as the first source drift region 19 and the first drain drift region 20, and in a cross-sectional view cutting through the epitaxial layer 4 in the thickness direction from the surface thereof, the second diffusion regions 33 have substantially the same width as the first source drift region 19 and the first drain drift region 20. In other words, the second diffusion regions 33 have gaps from the first diffusion region 22 and the third diffusion region 24 in a manner similar to that of the first source drift region 19 and the first drain drift region 20.

Also, the second diffusion regions 33 have gaps with the first source drift region 19, the first drain drift region 20, and the embedded layer 5, and the bottoms of the second diffusion regions 33 are formed at a greater depth than the bottom of the first diffusion region 22. In other words, the second diffusion regions 33 are formed so as to be surrounded by the p-type well region 10. That is, the second diffusion regions 33 respectively face the base portion 6 of the embedded layer 5, the first diffusion region 22, the third diffusion region 24, the first source drift region 19, and the first drain drift region 20 through the p-type well region 10.

In the region between the second diffusion region 33 and the first source drift region 19 and the region between the second diffusion region 33 and the first drain drift region 20, second withstand voltage maintaining regions 34 are respectively formed. The second withstand voltage maintaining regions 34 are portions of the p-type well region 10, and the impurity concentration of the second withstand voltage maintaining regions 34 is lower than that of the second diffusion regions 33. Between the first source drift region 19 and the first withstand voltage maintaining region 23 and between the first drain drift region 20 and the first withstand voltage maintaining region 23, p-n junctions are formed.

Next, a manufacturing step for the semiconductor device 32 will be described with reference to FIG. 4.

Figure 4:
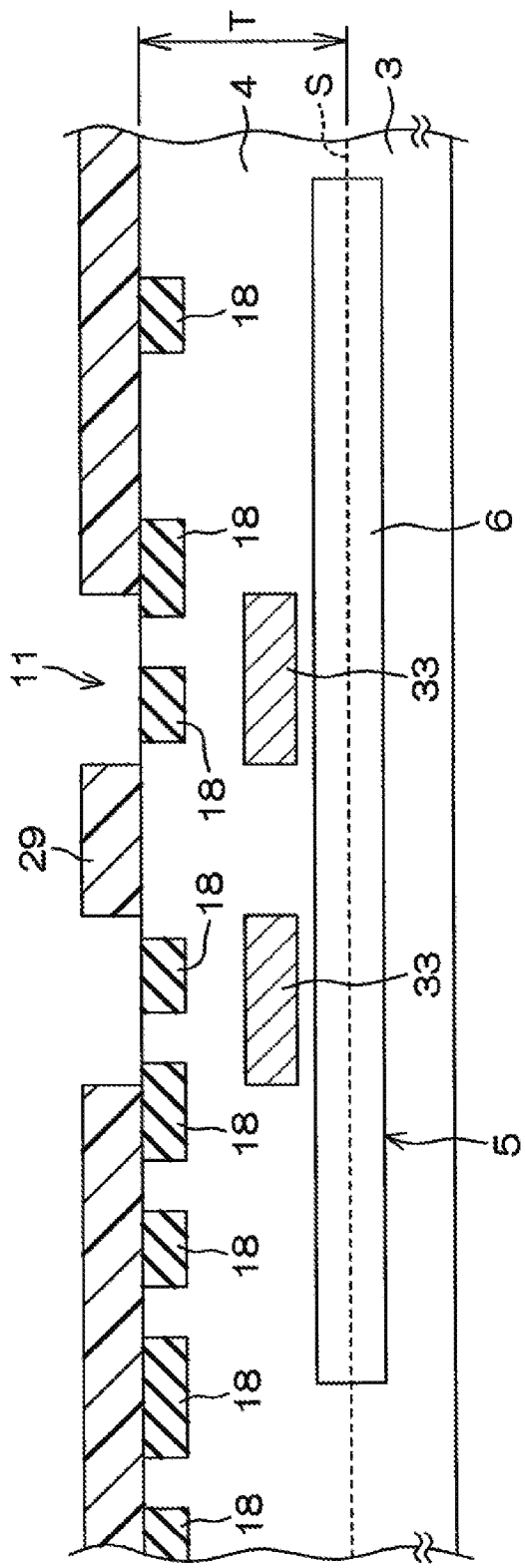
FIG. 4 is a cross-sectional view for describing a manufacturing step of the semiconductor device in FIG. 3.

FIG. 4 is a cross-sectional view for describing an example of a manufacturing step for the semiconductor device 32 according to Embodiment 2 of the present invention. The difference between the manufacturing steps for the semiconductor device 32, and the manufacturing steps for the semiconductor device 1 of Embodiment 1 is that there is an addition of a step of forming the second diffusion regions 33 directly under the first source drift region 19 and the first drain drift region 20, prior to the step of forming the first source drift region 19 and the first drain drift region 20 (refer to FIG. 2D). Other manufacturing steps are similar to those of the semiconductor device 1, and thus, descriptions thereof are omitted.

To manufacture the semiconductor device 32, as shown in FIG. 4, the step of forming the second diffusion regions 33 is added prior to the step of forming the first source drift region 19 and the first drain drift region 20 (refer to FIG. 2D). In other words, the second diffusion regions 33 are formed by implanting boron (B) ions as the p-type impurity through the same ion implantation mask 29 used when forming the first source drift region 19 and the first drain drift region 20. The conditions for implanting the p-type impurity are that the doping energy is 500 keV to 1000 keV, with a dose of $8.0 \times 10^{11}/cm^2$ to $1.2 \times 10^{12}/cm^2$, for example.

In this manner, the second diffusion regions 33 having the same pattern as the first source drift region 19 and the first drain drift region 20 are formed at a greater depth than the first source drift region 19 and the first drain drift region 20. After forming the second diffusion regions 33, the first source drift region 19 and the first drain drift region 20 are formed by the aforementioned step shown in FIG. 2D. Then, the steps of FIGS. 2E to 2G are performed in that order to form the semiconductor device 32.

Next, the source/drain withstand voltage and the well/substrate withstand voltage in the present embodiment will be described.

Similar to the previous embodiment, based on the semiconductor device 32 of FIG. 3, the thickness T of the epitaxial layer 4 was changed in a simulation, and the withstand voltages between the respective regions were studied under various conditions. The tests done by simulation were conducted with the thickness T of the epitaxial layer 4 being changed in order between 7 µm, 6 µm, and 5 µm. Other conditions are similar to those of the previous embodiment.

According to the simulation results, the source/drain withstand voltage was 45.6V when the thickness T was 7 µm, 45.0V when the thickness T was 6 µm, and 27.0V when the thickness T was 5 µm.

Also, the well/substrate withstand voltage was 68.5V when the thickness T was 7 µm, 45.4V when the thickness T was 6 µm, and 20.0V when the thickness T was 5 µm.

According to the results above, it can be seen that while the source/drain withstand voltage and the well/substrate withstand voltage decrease as the thickness T of the epitaxial layer 4 decreases, the withstand voltages are improved compared to the previous embodiment. Also, in any of the cases, even if the thickness T of the epitaxial layer 4 is made thinner, the amount of decrease in the withstand voltages is smaller than in the previous embodiment, and it can be seen that the dependence of the source/drain withstand voltage and the well/substrate withstand voltage on the thickness T of the epitaxial layer 4 is decreased.

As described above, according to the configuration of Embodiment 2 of the present invention, the second diffusion regions 33 having a higher concentration than the epitaxial layer 4 are additionally formed directly below the first source drift region 19 and the first drain drift region 20. As a result, it is possible to decrease the dependence of the source/drain withstand voltage on the thickness T of the epitaxial layer 4. In other words, even in variation occurred in the thickness T of the epitaxial layer 4 in the manufacturing process, the variation in withstand voltage resulting from the variation in thickness T of the epitaxial layer 4 can be made less than the variation in thickness T. As a result, it is possible to more effectively stabilize the source/drain withstand voltage.

Also, the second diffusion regions 33 can be formed through the same ion implantation mask 29 as the first source drift region 19 and the first drain drift region 20, and thus, it is possible to manufacture the semiconductor device 32 having a stable source/drain withstand voltage and well/substrate withstand voltage while preventing an increase in the number of manufacturing steps.

Figure 5:
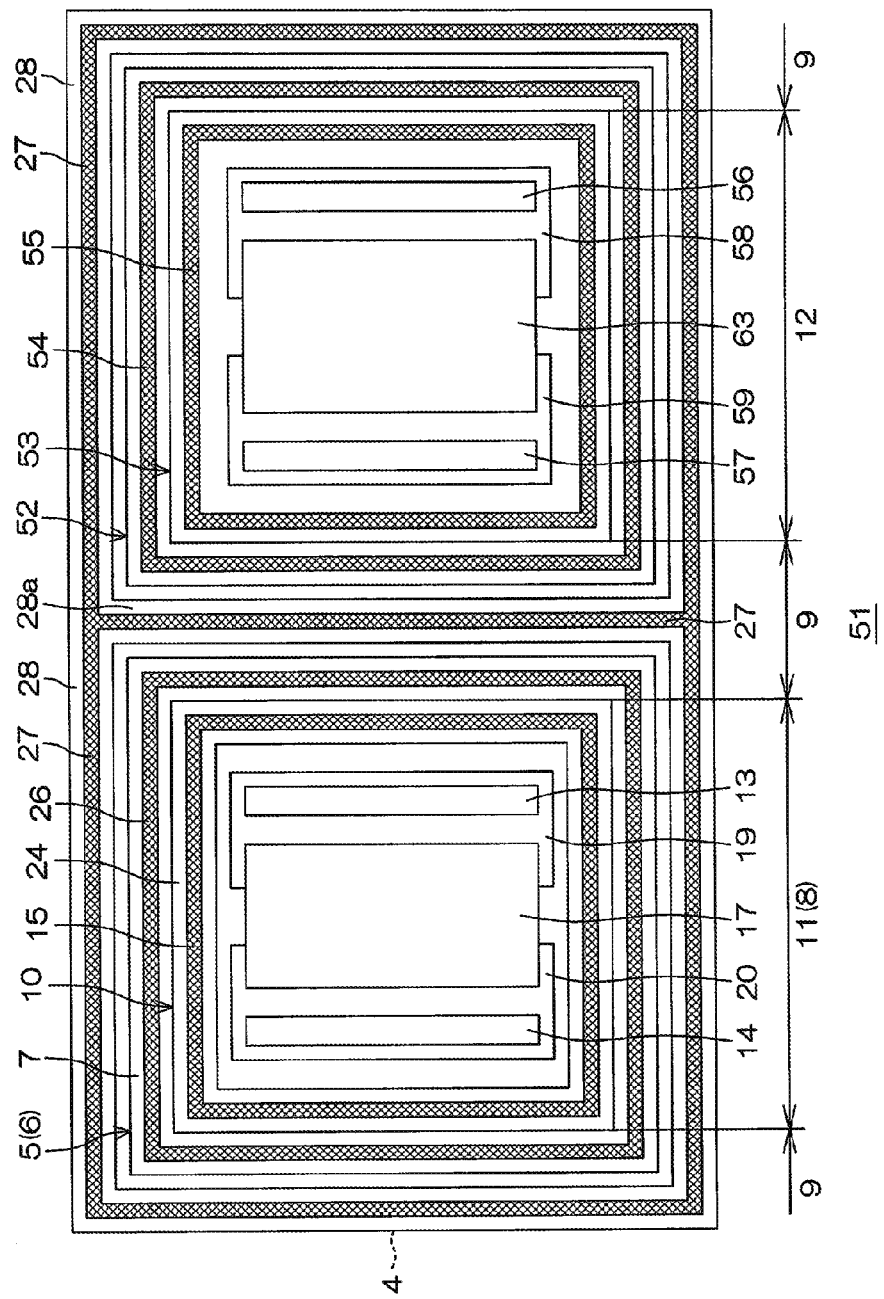
FIG. 5 is a schematic plan view of a semiconductor device of Embodiment 3 of the present invention.
Figure 6A:
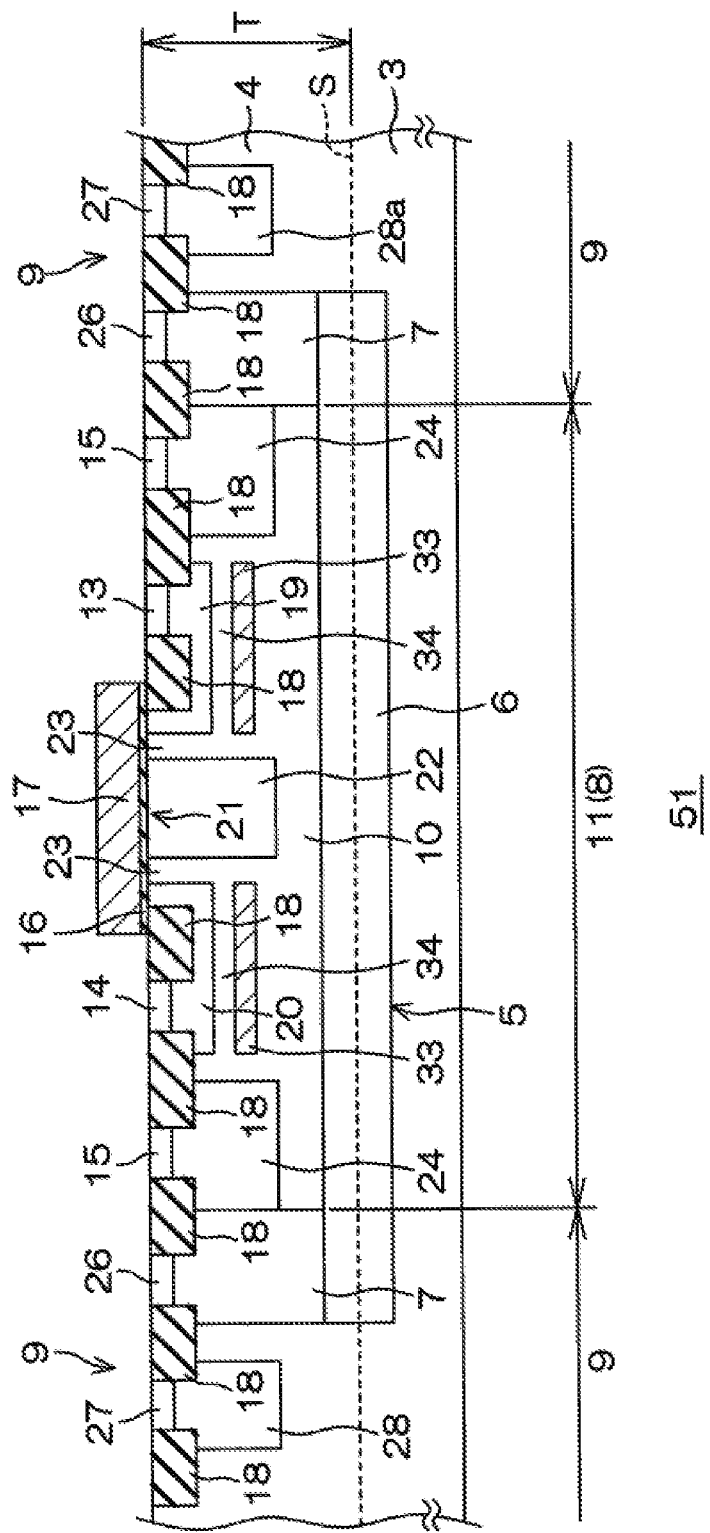
FIG. 6A is a cross-sectional view of a first transistor region shown in FIG. 5.
Figure 6B:
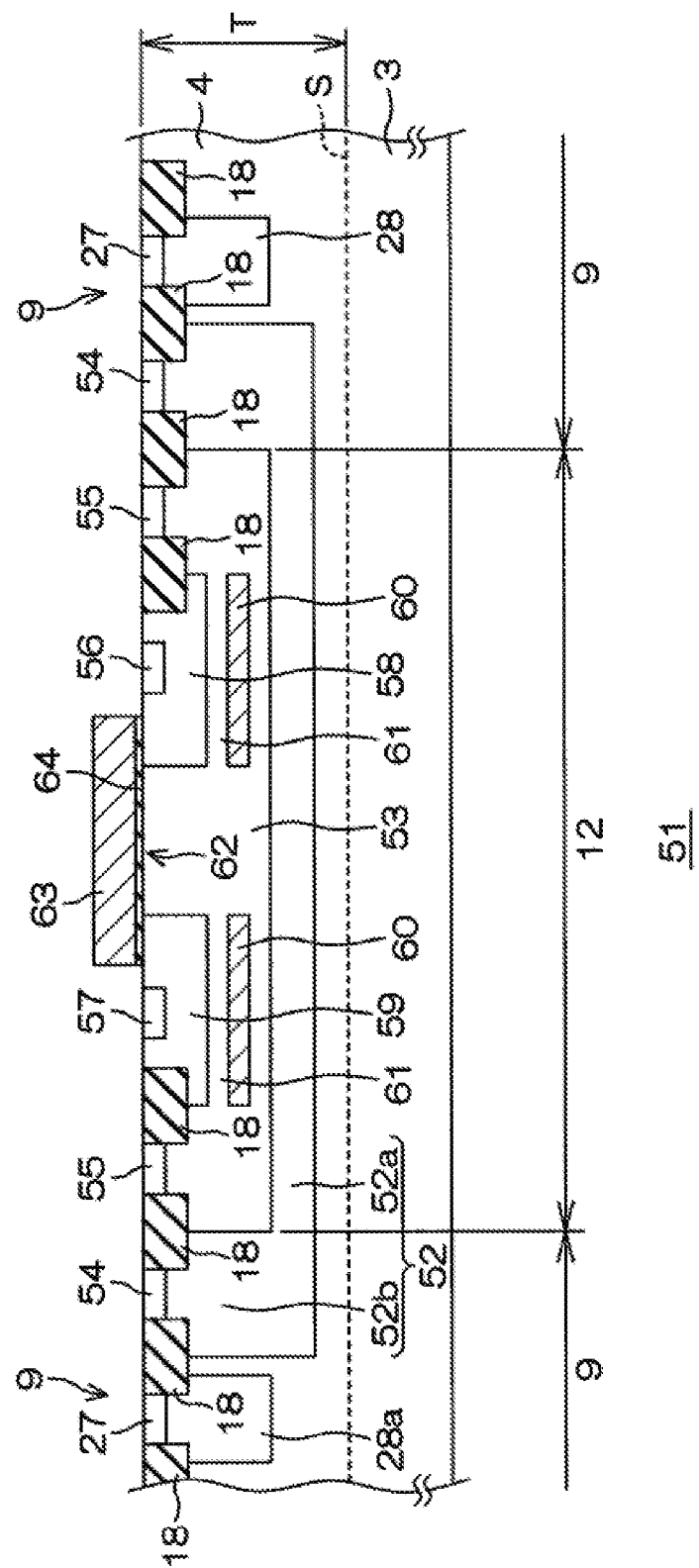
FIG. 6B is a cross-sectional view of a second transistor region shown in FIG. 5.

FIG. 5 is a schematic plan view of a semiconductor device 51 according to Embodiment 3 of the present invention. FIG. 6A is a cross-sectional view of a first transistor region 11 shown in FIG. 5. FIG. 6B is a cross-sectional view of a second transistor region 12 shown in FIG. 5.

The semiconductor device 51 differs from the aforementioned semiconductor devices 1 and 32 in that an active region 8 is formed as the first transistor region 11, and in that a second transistor region 12 is formed outside the p-type well region 10.

In the present embodiment, the configuration of the semiconductor device 51 will be described in detail using an example in which the first transistor region 11 and the second transistor region 12 are respectively formed in a substantially quadrilateral shape as viewed in a plan view from the direction normal to the epitaxial layer 4. The configuration of FIG. 5 may naturally be applied to the semiconductor devices 1 and 32 of Embodiments 1 and 2. Element separators 18 are not shown in FIG. 5.

The configuration of the first transistor region 11 and the configuration of the second transistor region 12 will be described in that order below.

<Plan View Configuration of First Transistor Region 11>

As shown in FIG. 5, the embedded layer 5 includes a base portion 6 formed in a substantially quadrilateral shape in a plan view, and a side portion 7 formed in a substantially quadrilateral loop shape in a plan view around the base portion 6, the side portion 7 surrounding the inner region of the base portion 6 (in other words, the p-type well region 10). Due to the embedded layer 5, the first transistor region 11 (active region 8) having the substantially quadrilateral shape in a plan view, and the outer region 9 outside the first transistor region 11 are separate. In the surface of the side portion 7 of the embedded layer 5, a guard ring region 26 having a substantially quadrilateral loop shape in a plan view is formed along the surface of the side portion 7 (see crosshatched portion in FIG. 5).

In the p-type well region 10, the third diffusion region 24, a first source region 13 and a first drain region 14 are formed. The third diffusion region 24 is formed in a substantially quadrilateral loop shape in a plan view with the side face thereof facing the outer region 9 maintaining contact with the side face of the side portion 7 facing the first transistor region 11. On the surface of the third diffusion region 24, a well contact region 15 having a substantially quadrilateral loop shape in a plan view is formed along the surface of the third diffusion region 24 (see crosshatched portion of FIG. 5).

The first source region 13 and the first drain region 14 are formed in parallel with each other with a gap therebetween so as to form stripes, and are respectively disposed at gaps from the inner side face of the third diffusion region 24. The first source drift region 19 and the first drain drift region 20 are formed along the direction of the stripes of the first source region 13 and the first drain region 14 so as to individually surround the first source region 13 and the first drain region 14.

The first gate region 17 is formed along the direction of the stripes of the first source region 13 and the first drain region 14 so as to straddle the first source drift region 19 and the first drain drift region 20.

In the outer region 9 a fourth diffusion region 28 having a substantially quadrilateral loop shape in a plan view is formed so as to surround the embedded layer 5. The fourth diffusion region 28 is formed at a gap from the embedded layer 5 towards the outer region 9, and as a result, the area where the first transistor region 11 is formed is delineated. In the present embodiment, the fourth diffusion region 28 between the first transistor region 11 and the second transistor region 12 is formed integrally as a common portion 28a that separates the first transistor region 11 from the second transistor region 12. On the surface of the fourth diffusion region 28 (common portion 28a), a substrate contact region 27 having a substantially quadrilateral loop shape in a plan view is formed along the surface of the fourth diffusion region 28 (see crosshatched portion of FIG. 5).

The element separators 18 are configured in a manner similar to that of Embodiment 1, and are formed so as to respectively surround the first source region 13, the first drain region 14, the well contact region 15, the guard ring region 26, and the substrate contact region 27. In other words, the element separators 18 are formed in substantially quadrilateral loop shapes in a plan view so as to surround the respective regions 13, 14, 15, 26, and 27.

<Cross-Sectional Configuration of First Transistor Region 11>

As shown in FIG. 6A, the area between the first source drift region 19 and the first drain drift region 20 (channel region 21) has formed therein the first diffusion region 22 along the direction of the stripes of the first source region 13 and the first drain region 14. In other words, the first withstand voltage maintaining regions 23 interposed respectively between the first diffusion region 22 and the first source drift region 19 and the first drain drift region 20 are formed along the direction of the stripes.

Directly below the first source drift region 19 and the first drain drift region 20, the second diffusion regions 33 are formed in the same pattern as the first source drift region 19 and the first drain drift region 20. The second diffusion regions 33 in the present embodiment are located in the area between the bottoms of the first source drift region 19 and the first drain drift region 20, and the bottoms of the first and third diffusion regions 22 and 24. In the respective areas between the tops of the second diffusion regions 33 and the bottoms of the first source drift region 19 and the first drain drift region 20, second withstand voltage maintaining regions 34 that are a portion of the p-type well region 10 are formed as stripes.

Next, the configuration of the second transistor region 12 will be described.

<Plan View Configuration of Second Transistor Region 12>

As shown in FIG. 5, in the area opposite to the first transistor region 11 across the fourth diffusion region 28 (common portion 28a), an n-type embedded layer 52 and a p-type well region 53 are formed.

The embedded layer 52 is formed in a substantially quadrilateral shape in a plan view with a gap from the side face of the fourth diffusion region 28 (common portion 28a). The p-type well region 53 is formed in the inner portion of the embedded layer 52 at a smaller area than that of the embedded layer 52. The p-type well region 53 delineates the second transistor region 12 from an outer region 9 outside of the second transistor region 12.

An n-type impurity region 54 is formed on the surface of the embedded layer 52. The n-type impurity region 54 is formed in a substantially quadrilateral loop shape in a plan view between the side face of an n-type well region and the side face of the p-type well region 53 (see crosshatched portion in FIG. 5).

In the p-type well region 53, the p-type impurity region 55, a second source region 56 and a second drain region 57 are formed. The p-type impurity region 55 is formed in a substantially quadrilateral loop shape in a plan view with a gap from the side face of the p-type well region 53 (see crosshatched portion in FIG. 5).

A second source region 56 and a second drain region 57 are formed in parallel with each other with a gap therebetween so as to form stripes, and are respectively disposed at gaps from the inner side face of the p-type impurity region 55. A second source drift region 58 and a second drain drift region 59 constituting a pair are formed along the direction of the stripes of the second source region 56 and the second drain region 57 so as to individually surround the second source region 56 and the second drain region 57. A second gate electrode 63 is formed so as to straddle the second source drift region 58 and the second drain drift region 59.

The second gate electrode 63 is formed along the direction of the stripes of the second source region 56 and the second drain region 57.

In the outer region 9 of the second transistor region 12, the fourth diffusion region (including the common portion 28a) having the substantially quadrilateral loop shape in a plan view is formed so as to surround the embedded layer 52. The fourth diffusion region 28 is formed at a gap from the embedded layer 52, thus delineating the area where the second transistor region 12 is formed. Similar to the configuration of the first transistor region 11, on the surface of the fourth diffusion region 28, the substrate contact region 27 having the substantially quadrilateral loop shape in a plan view (see cross-hatched portion in FIG. 5) is formed along the surface of the fourth diffusion region 28.

The element separators 18 in the second transistor region 12 are formed so as to respectively surround the n-type impurity region 54 and the p-type impurity region 55. That is, the element separators 18 are formed in substantially quadrilateral loop shapes in a plan view so as to respectively surround the regions 54 and 55. The element separators 18 will be described in detail below.

<Cross-Sectional Configuration of Second Transistor Region 12>

As shown in FIG. 6B, the embedded layer 52, like the aforementioned embedded layer 5, includes a relatively high concentration base portion 52a formed along a direction perpendicular to the thickness direction of the epitaxial layer 4, and a relatively low concentration side portion 52b formed around the base portion 52a so as to surround the inner area of the base portion 52a (that is, the p-type well region 53).

The base portion 52a of the embedded layer 52 is formed in a substantially quadrilateral shape in a plan view between the surface of the epitaxial layer 4 and a boundary face S between the semiconductor substrate 3 and the epitaxial layer 4. As a result, the embedded layer 52 is formed shallower than the epitaxial layer 4.

On the other hand, the side portion 52b of the embedded layer 52 is formed so as to extend in the thickness direction of the epitaxial layer 4 from the bottom portion of the element separator 18 (inner element separator 18) that surrounds the substrate contact region 27, and the side portion 52b is in contact (integrally formed) with the peripheral portions of the base portion 52a. The side portion 52b of the embedded layer 52 has a boundary with the epitaxial layer 4 at a position at a gap from the fourth diffusion region 28 (common portion 28a). The n-type impurity concentration of the base portion 52a is $1.0\times10^{17}/cm^3$ to $2.0\times10^{17}/cm^3$, and the n-type impurity concentration of the side portion 52b is $1.0\times10^{16}/cm^3$ to $2.0\times10^{16}/cm^3$, for example.

In the inner portion of the embedded layer 52 (side portion 52b of the embedded layer 52), an element separator 18 having a substantially rectangular loop shape in a plan view is formed at a gap from the element separator 18 (inner element separator 18) that surrounds the substrate contact region 27, and an n-type impurity region 54 is formed so as to be surrounded the respective element separators 18. The n-type impurity region 54 is formed at the same concentration and depth as the aforementioned guard ring region 26, for example.

The p-type well region 53 is formed so as to extend in the thickness direction of the epitaxial layer 4 from the bottom of the element separator 18 (inner element separator 18) that surrounds the n-type impurity region 54. The p-type well region 53 is formed so as to be shallower than the base portion 52a of the embedded layer 52, and the bottom of the p-type well region 53 is located between the surface of the epitaxial layer 4 and the base portion 52a of the embedded layer 52. The p-type well region 53 is formed at the same concentration and depth as the aforementioned first and third diffusion regions 22 and 24, for example. In other words, the p-type well region 53 corresponds to the fifth diffusion region 25 of the second transistor region 12 of Embodiments 1 and 2.

In the inner portion of the p-type well region 53, an element separator 18 having a substantially rectangular loop shape in a plan view is formed at a gap from the element separator 18 (inner element separator 18) surrounding the n-type impurity region 54, and the p-type impurity region 55 is formed so as to be surrounded by the respective element separators 18. The p-type impurity region 55 is formed at the same concentration and depth as the aforementioned well contact region 15, for example.

The second source region 56 and the second drain region 57 are respectively formed at gaps from the element separator 18 formed on the inside of the p-type well region 53. The depth and impurity concentration of the second source region 56 and the second drain region 57 is the same as the aforementioned first source region 13 and the first drain region 14, for example.

The side faces of the second source drift region 58 and the second drain drift region 59 facing the outer region 9 are formed at a gap from the side face of the p-type well region 53, and are formed so as to extend in the thickness direction of the epitaxial layer 4 from the bottom of the element separator 18 formed in the inner portion of the p-type well region 53.

On the other hand, the side faces of the second source drift region 58 and the second drain drift region 59 opposite to the outer region 9 have formed therebetween a second channel region 62 formed facing the second source drift region 58 and the second drain drift region 59 across the p-type well region 53. The depth and impurity concentration of the second source drift region 58 and the second drain drift region 59 are the same as the aforementioned first source drift region 19 and the first drain drift region 20, for example.

In the areas of the p-type well region 53 directly below the second source drift region 58 and the second drain drift region 59, sixth diffusion regions 60 having a higher impurity concentration than the epitaxial layer 4 are formed.

The sixth diffusion regions 60 are formed in the same pattern as the second source drift region 58 and the second drain drift region 59. The sixth diffusion regions 60 are formed between the respective bottoms of the second source drift region 58 and the second drain drift region 59, and the base portion 52a of the embedded layer 52. The sixth diffusion regions 60 respectively face the second source drift region 58 and the second drain drift region 59 across the p-type well region 53. In the respective areas between the sixth diffusion region 60 and the second source drift region 58 and between the sixth diffusion region 60 and second drain drift region 59, p-n junctions are formed, thus forming third withstand voltage maintaining regions 61 that are portions of the p-type well region 53. The sixth diffusion regions 60 are formed at the same concentration and depth as the second diffusion regions 33 in the first transistor region 11.

On the surface of the epitaxial layer 4, a second gate electrode 63 is formed so as to face the second channel region 62 across a second gate insulating film 64. More specifically, the second gate electrode 63 faces a portion that overlaps the p-type well region 53, the second source drift region 58, and the second drain drift region 59, across the second gate insulating film 64. In this manner, a planar gate-type MOSFET is formed in the second transistor region 12.

Such a second transistor region 12 can be formed in the same steps used in the manufacturing of the first transistor region 11 after adding a step of forming the embedded layer 52 (implanting an n-type impurity) in the middle of the epitaxial growth step prior to the step of FIG. 2D.

In other words, it is possible to form the second source drift region 58 and the second drain drift region 59 in the step of FIG. 2D. Also, it is possible to form the p-type well region 53 in the step of FIG. 2E, or in other words, the same step as forming the first, third, and fifth diffusion regions 22, 24, and 25. Additionally, it is possible to form the sixth diffusion regions 60 in the step of FIG. 4, or in other words, the same step as forming the second diffusion regions 33. Furthermore, it is possible to form the n-type impurity region 54, the second source region 56 and second drain region 57, the second gate insulating film 64, and the second gate electrode 63 in the same step as in FIG. 2G.

As described above, even with the configuration of the semiconductor device 51, it is possible to attain effects similar to those of Embodiment 1.

Also, in the second transistor region 12, the sixth diffusion regions 60 and the third withstand voltage maintaining regions 61 are formed. As a result, it is possible to decrease the dependence of the source/drain withstand voltage on the thickness T of the epitaxial layer 4. In other words, even in variation occurred in the thickness T of the epitaxial layer 4 in the manufacturing process, the variation in withstand voltage resulting from the variation in thickness T of the epitaxial layer 4 can be made less than the variation in thickness T. As a result, even in the second transistor region 12, it is possible to more effectively stabilize the source/drain withstand voltage.

The planar gate-type MOSFET in the second transistor region 12 may naturally be formed in the second transistor region 12 in the active region 8, in a manner similar to the aforementioned semiconductor devices 1 and 32.

Also, in the present embodiment, in the second transistor region 12, an example is shown in which the sixth diffusion regions 60 are formed only directly below the second source drift region 58 and the second drain drift region 59, but a high concentration diffusion region (sixth diffusion region 60) may be formed in an area other than directly below the second source drift region 58 and the second drain drift region 59.

For example, a high concentration diffusion region may be formed across the area directly below the channel region 62 in a direction perpendicular to the thickness direction of the epitaxial layer 4. Also, the high concentration diffusion region and the sixth diffusion regions 60 adjacent to each other may be formed integrally. Also, a lead-out portion extending from the respective ends of the sixth diffusion regions 60 facing the outer region 9 towards the side portions 52b of the embedded layer 52 may be provided, and a high concentration diffusion region having the same shape in a plan view as the p-type well region 53 may be formed in the entirety of the middle of the p-type well region 53 in the depth direction.

Also, in the present embodiment, an example in which the second diffusion regions 33 and the sixth diffusion regions 60 (high concentration diffusion regions) are formed so as to be relatively thin was described, but such thin second diffusion regions 33 and sixth diffusion regions 60 (high concentration diffusion regions) may be formed across a plurality of layers. In such a case, the top portion and bottom portion of the high concentration diffusion region formed in the lowermost layer may be formed between the first diffusion region 22 and the boundary face S between the semiconductor substrate 3 and the epitaxial layer 4.

Figure 7:
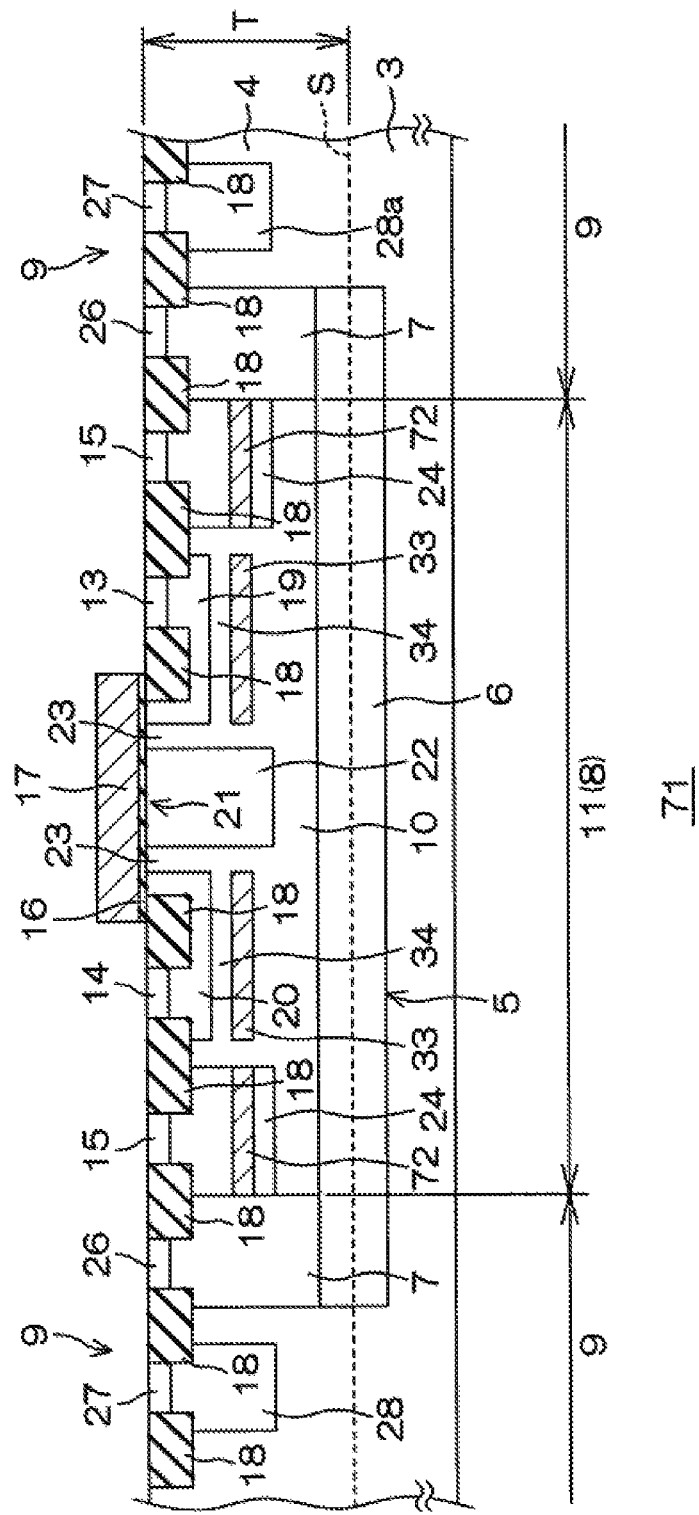
FIG. 7 is a schematic cross-sectional view of a semiconductor device of Embodiment 4 of the present invention.

FIG. 7 is a schematic cross-sectional view of a semiconductor device 71 according to Embodiment 4 of the present invention.

The semiconductor device 71 differs from the semiconductor device 51 of Embodiment 3 in that the third diffusion region 24 includes the seventh diffusion region 72 as a high concentration impurity region. Other configurations are similar to those of the aforementioned semiconductor device 51. In FIG. 7, the second transistor region 12 is omitted, and portions corresponding to those shown in FIGS. 1 to 6B are assigned the same reference characters and descriptions thereof are omitted.

The seventh diffusion region 72 is formed in the same pattern as the third diffusion region 24 in a plan view. In other words, the seventh diffusion region 72 is formed in a substantially rectangular loop in a plan view at the same width as the third diffusion region 24. More specifically, the seventh diffusion region 72 is formed in a substantially rectangular loop shape in a plan view while maintaining a state in which the respective side faces thereof facing the outer region 9 and the first transistor region 11 are in contact with the respective side faces of the third diffusion region 24 that face the outer region 9 and the first transistor region 11.

Also, the seventh diffusion region 72 is formed in the middle of the third diffusion region 24 in the depth direction. In other words, the seventh diffusion region 72 is located between the surface of the epitaxial layer 4 and the bottom of the third diffusion region 24. It is preferable that the seventh diffusion region 72 be formed at the same depth and concentration as the second diffusion regions 33. In such a case, it is possible to form the seventh diffusion region 72 simply by modifying the layout of the ion implantation mask 29 used when forming the second diffusion regions 33 in FIG. 4.

In this manner, the third diffusion region 24 includes the seventh diffusion region 72 as the high concentration impurity region, and thus, it is possible to form a region having a higher impurity concentration than the epitaxial layer 4 (that is, the third and seventh diffusion regions 24 and 72) over a wide area within the p-type well region 10. As a result, it is possible to further decrease the dependence of the source/drain withstand voltage on the thickness T of the epitaxial layer 4. Also, even if variation were to occur in the thickness T of the epitaxial layer 4 during the manufacturing process, it is possible to further reduce the variation in withstand voltage resulting from the variation in thickness to a greater degree than the variation in thickness. As a result, it is possible to more effectively stabilize the source/drain withstand voltage.

Also, while it is preferable that the seventh diffusion region 72 be formed in the same pattern as the third diffusion region 24, it is not necessarily required for the seventh diffusion region 72 to be formed in the same pattern as the third diffusion region 24. In other words, as long as a portion of the third diffusion region 24 includes the seventh diffusion region 72, it is possible to achieve to a considerable degree the effect of reducing the dependence of the source/drain withstand voltage on the thickness T of the epitaxial layer 4.

Figure 8:
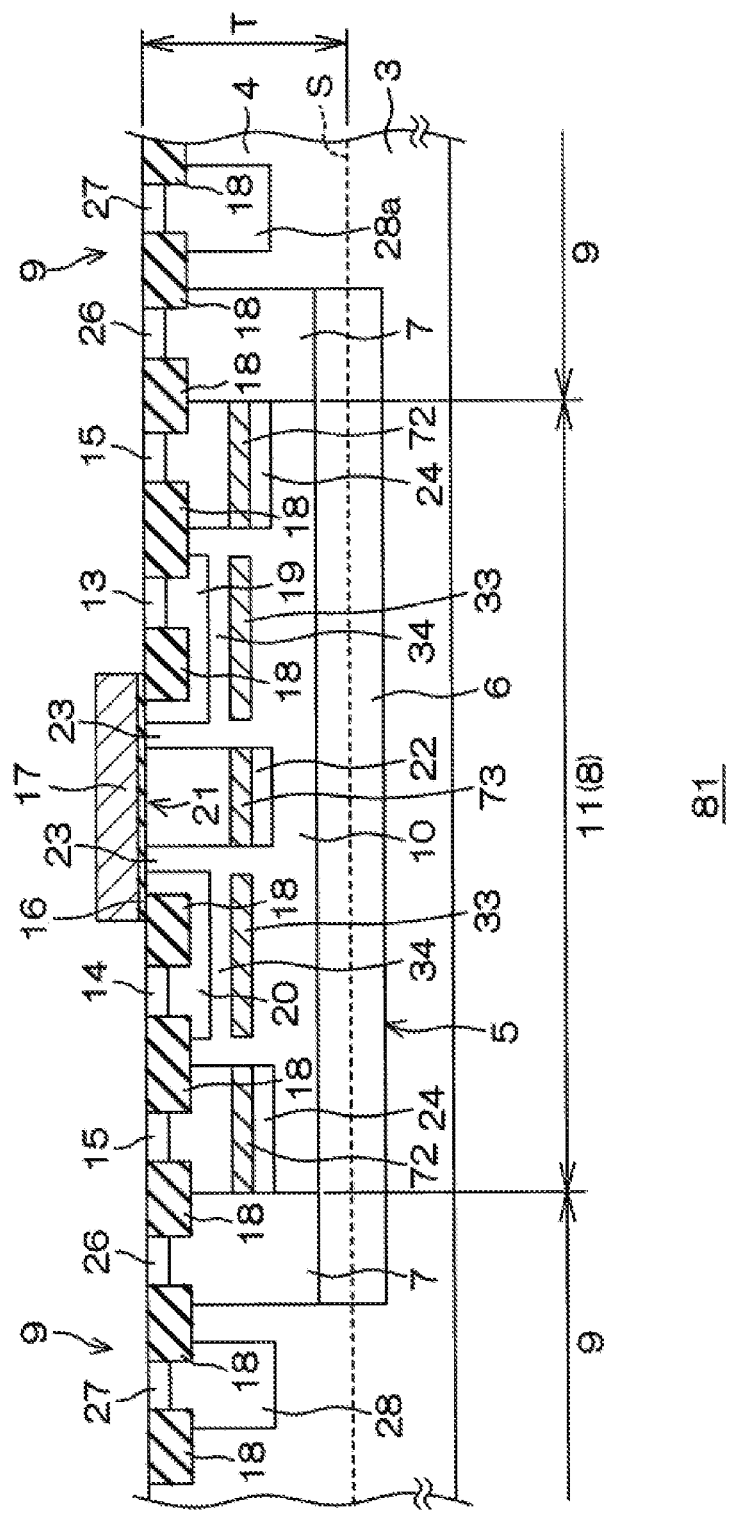
FIG. 8 is a schematic cross-sectional view of a semiconductor device of Embodiment 5 of the present invention.

FIG. 8 is a schematic cross-sectional view of a semiconductor device 81 according to Embodiment 5 of the present invention.

The semiconductor device 81 differs from the semiconductor device 71 of Embodiment 4 in that the first diffusion region 22 includes the eighth diffusion region 73 as a high concentration impurity region. Other configurations are similar to those of the aforementioned semiconductor device 71. In FIG. 8, the second transistor region 12 is omitted, and portions corresponding to those shown in FIGS. 1 to 7 are assigned the same reference characters and descriptions thereof are omitted.

The eighth diffusion region 73 is formed in the same pattern as the first diffusion region 22 in a plan view. More specifically, the eighth diffusion region 73 is formed in the middle of the first diffusion region 22 in the depth direction. In other words, the eighth diffusion region 73 is located between the surface of the epitaxial layer 4 and the bottom of the first diffusion region 22. It is preferable that the eighth diffusion region 73 be formed at the same depth and concentration as the second diffusion regions 33 and the seventh diffusion region 72. In such a case, it is possible to form the eighth diffusion region 73 simply by modifying the layout of the ion implantation mask 29 used when forming the second diffusion regions 33 in FIG. 4.

Even with such a configuration, it is possible to attain effects similar to those of the semiconductor device 71 of Embodiment 4.

Also, while it is preferable that the eighth diffusion region 73 be formed in the same pattern as the first diffusion region 22, it is not necessarily required for the eighth diffusion region 73 to be formed in the same pattern as the first diffusion region 22. In other words, as long as a portion of the first diffusion region 22 includes the eighth diffusion region 73, it is possible to achieve to a considerable degree the effect of reducing the dependence of the source/drain withstand voltage on the thickness T of the epitaxial layer 4.

Figure 9:
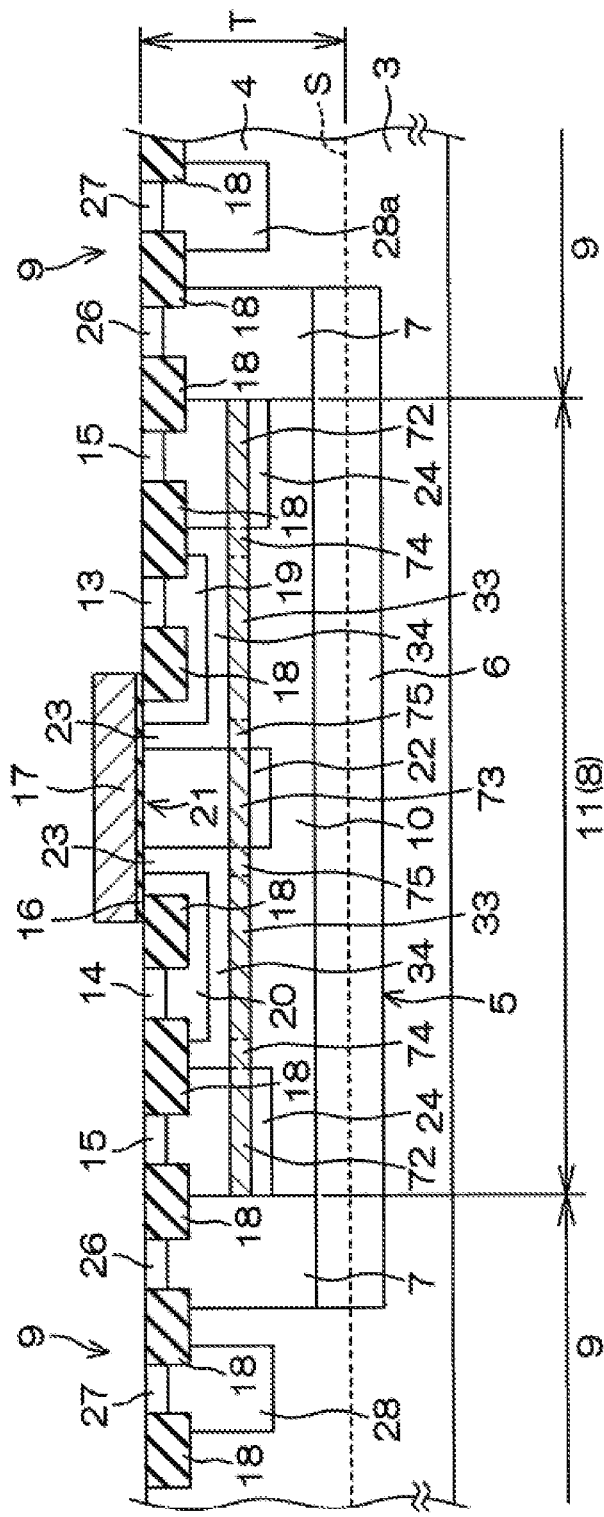
FIG. 9 is a schematic cross-sectional view of a semiconductor device of Embodiment 6 of the present invention.

FIG. 9 is a schematic cross-sectional view of a semiconductor device 91 according to Embodiment 6 of the present invention.

The semiconductor device 91 differs from the semiconductor device 81 of Embodiment 5 in that the second diffusion region 33, the seventh diffusion region 72, and the eighth diffusion region 73 are formed integrally due to first and second lead-out portions 74 and 75. Other configurations are similar to those of the aforementioned semiconductor device 71. In FIG. 9, the second transistor region 12 is omitted, and portions corresponding to those shown in FIGS. 1 to 8 are assigned the same reference characters and descriptions thereof are omitted.

As shown in FIG. 9, in the p-type well region 10 of the present embodiment, first lead-out portions 74 that connect the second diffusion region 33 and the seventh diffusion region 72, and second lead-out portions 75 that connect the second diffusion region 33 and the eighth diffusion region 73 are formed. The first lead-out portions 74 connect the second diffusion region 33 and the seventh diffusion region 72 across a boundary between the third diffusion region 24 and the p-type well region 10. On the other hand, the second lead-out portions 75 connect the second diffusion region 33 and the eighth diffusion region 73 across the boundary between the p-type well region 10 and the first diffusion region 22.

The first and second lead-out portions 74 and 75 are both formed as high concentration diffusion regions, and the second diffusion region 33, the seventh diffusion region 72, and the eighth diffusion region 73 are formed at the same concentration and depth. With such first and second lead-out portions 74 and 75, an integral high concentration diffusion region can be formed in the p-type well region 10 simply by changing the layout of the ion implantation mask 29 used when forming the second diffusion regions 33 in FIG. 4.

As described above, according to the semiconductor device 91, the high concentration diffusion region is formed integrally in the same shape as the p-type well region 10 in a plan view (substantially rectangular shape in a plan view in the present embodiment). Thus, it is possible to further improve the effects of the semiconductor devices 71 and 81 in Embodiments 4 and 5.

Embodiments of the present invention were described above, but the present invention can also be implemented in other embodiments.

For example, in the respective embodiments above, a configuration was described in which the first diffusion region 22 is formed at a gap from both the first source drift region 19 and the first drain drift region 20 that form a pair, but the first diffusion region 22 may be in contact with one of the drift regions (first source drift region 19 or first drain drift region 20).

Also, the first transistor regions 11 of the respective embodiments above may be high withstand voltage transistor regions with withstand voltages of 35V to 45V, for example. Also, in the respective embodiments above, the second transistor region 12 may have formed therein various circuit elements such as capacitors and resistors.

In the respective embodiments above, the epitaxial layer 4 was described as having a conductive type of p, but the epitaxial layer 4 may instead have the opposite conductive type of n. In such a case, the conductive types of the other regions need to be inverted along with the change in conductive type of the epitaxial layer 4.

Also, in Embodiment 2 above, a configuration was described in which the second diffusion regions 33 are formed in the same pattern as the first source drift region 19 and the first drain drift region 20, but as shown in FIGS. 7 to 9, the second diffusion regions 33 may be embedded in the first diffusion region 22 and/or the third diffusion region 24. Also, the second diffusion regions 33 may be embedded directly below the first diffusion region 22 and/or the third diffusion region 24, so as to face the first diffusion region 22 and/or the third diffusion region 24. In such a case, the second diffusion region 33 may be formed in the same pattern as the first diffusion region 22 and the third diffusion region 24.

Furthermore, a second diffusion region 33 may be formed integrally in the same pattern as the first source drift region 19 and the first drain drift region 20 across the areas directly below the first withstand voltage maintaining regions 23 in the direction perpendicular to the thickness direction of the epitaxial layer 4, by providing the second diffusion regions 33 formed directly below the first diffusion region 22 and the third diffusion region 24 with lead-out portions similar to those shown in FIG. 9.

Besides these, various modifications in design can be made within the scope of the claims.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor layer of a first conductive type having selectively formed therein a field effect transistor region;
   a source region and a drain region of a second conductive type formed in a surface of the semiconductor layer with a gap therebetween in the field effect transistor region;
   a pair of drift regions of the second conductive type formed with a gap therebetween so as to surround individually the source region and the drain region;
   a gate electrode formed over the surface of the semiconductor layer across a gate insulating film so as to face a channel region formed in the area between the pair of drift regions; and
   a first diffusion region of the first conductive type formed in the channel region at a gap from at least one of the drift regions, the first diffusion region having a concentration higher than the semiconductor layer; and
   second diffusion regions of the first conductive type formed directly under at least the drift regions and having a concentration higher than the semiconductor layer.

2. The semiconductor device according to claim 1, wherein the second diffusion regions are formed at a gap from the drift regions.

3. The semiconductor device according to claim 1,
   wherein the first diffusion region is formed at a depth greater than the drift regions, and
   wherein bottoms of the second diffusion regions are at a depth greater than a bottom of the first diffusion region, and tops of the second diffusion regions are at a depth shallower than the bottom of the first diffusion region.

4. The semiconductor device according to claim 1, wherein the second diffusion regions have the same pattern as the drift regions.

5. The semiconductor device according to claim 1, wherein the first diffusion region is formed at gaps from both the drift regions.

6. The semiconductor device according to claim 1, further comprising an embedded region of the second conductive type embedded in the semiconductor layer so as to cause the field effect transistor region to be electrically floating as a well of the first conductive type.

7. The semiconductor device according to claim 6, further comprising a guard ring of the second conductive type formed in the surface of the semiconductor layer so as to surround the well of the first conductive type,
   wherein, the embedded region includes a relatively high concentration base portion that separates the well of the first conductive type from an area therebelow, and a side portion that has a lower concentration than the base portion and that contacts the guard ring so as to separate the well of the first conductive type from an area to the side thereof, the base portion and the side portion being formed integrally with each other.

8. The semiconductor device according to claim 7, further comprising:
   a well contact region of the first conductive type formed in the surface of the semiconductor layer in the well of the first conductive type; and
   a third diffusion region of the first conductive type formed so as to contact the well contact region, the third diffusion region having the same concentration and depth as the first diffusion region.

9. The semiconductor device according to claim 8, wherein the third diffusion region is formed so as to contact the side portion of the embedded region.

10. The semiconductor device according to claim 6, further comprising:
- a substrate contact region of the first conductive type formed in the surface of the semiconductor layer in a region opposite to the well of the first conductive type across a side portion of the embedded region; and
- a third diffusion region of the first conductive type formed to contact the substrate contact region, the fourth diffusion region having a higher concentration than the semiconductor layer.

11. The semiconductor device according to claim 10, wherein the third diffusion region is formed at a gap from the embedded region.

12. The semiconductor device according to claim 1, wherein the field effect transistor region is a high withstand voltage transistor region having a withstand voltage of 35V to 45V.

13. The semiconductor device according to claim 1, further comprising a region for another element selectively formed in the semiconductor layer, the region for another element being different from the field effect transistor region,
- wherein the region for another element has formed therein a third diffusion region of the first conductive type having the same concentration and depth as the first diffusion region.

* * * * *